United States Patent
Neudecker et al.

(10) Patent No.: US 8,599,572 B2
(45) Date of Patent: Dec. 3, 2013

(54) PRINTED CIRCUIT BOARD WITH INTEGRATED THIN FILM BATTERY

(75) Inventors: Bernd J. Neudecker, Littleton, CO (US); Joseph A. Keating, Broomfield, CO (US)

(73) Assignee: Infinite Power Solutions, Inc., Littleton, CO (US)

( * ) Notice: Subject to any disclaimer, the term of this patent is extended or adjusted under 35 U.S.C. 154(b) by 310 days.

(21) Appl. No.: 12/873,953

(22) Filed: Sep. 1, 2010

(65) Prior Publication Data

US 2011/0048781 A1    Mar. 3, 2011

Related U.S. Application Data

(60) Provisional application No. 61/238,889, filed on Sep. 1, 2009.

(51) Int. Cl.
  *H05K 1/18*    (2006.01)
  *H05K 1/11*    (2006.01)

(52) U.S. Cl.
  USPC ........... 361/762; 361/790; 361/793; 174/260; 429/152; 429/211; 429/156

(58) Field of Classification Search
  USPC ................ 361/760, 761, 762, 790, 792, 793; 174/260; 429/152, 211, 156
  See application file for complete search history.

(56) References Cited

U.S. PATENT DOCUMENTS

| | | | |
|---|---|---|---|
| 712,316 A | 10/1902 | Loppe et al. | |
| 2,970,180 A | 1/1961 | Urry | |
| 3,309,302 A | 3/1967 | Heil | |
| 3,616,403 A | 10/1971 | Collins et al. | |
| 3,790,432 A | 2/1974 | Fletcher et al. | |
| 3,797,091 A | 3/1974 | Gavin | |
| 3,850,604 A | 11/1974 | Klein | |
| 3,939,008 A | 2/1976 | Longo et al. | |
| 4,082,569 A | 4/1978 | Evans, Jr. | |
| 4,111,523 A | 9/1978 | Kaminow et al. | |
| 4,127,424 A | 11/1978 | Ullery, Jr. | |
| 4,226,924 A | 10/1980 | Kimura et al. | |
| 4,283,216 A | 8/1981 | Brereton | |
| 4,318,938 A | 3/1982 | Barnett et al. | |
| 4,328,297 A | 5/1982 | Bilhorn | |

(Continued)

FOREIGN PATENT DOCUMENTS

| CN | 1415124 | 4/2003 |
|---|---|---|
| CN | 1532984 | 9/2004 |

(Continued)

OTHER PUBLICATIONS

Inaguma, Yoshiyuki, "High Ionic Conductivity in Lithium Lanthanum Titanate," Solid State Communications, vol. 86, No. 10, pp. 689-693 (1993).

(Continued)

*Primary Examiner* — Hoa C Nguyen

(74) *Attorney, Agent, or Firm* — Blakely Sokoloff Taylor & Zafman, LLP

(57) ABSTRACT

The present invention relates to, for example, printed circuit boards having a thin film battery or other electrochemical cell between or within its layer or layers. The present invention also relates to, for example, electrochemical cells within a layer stack of a printed circuit board.

18 Claims, 9 Drawing Sheets

(56) References Cited

U.S. PATENT DOCUMENTS

| | | |
|---|---|---|
| 4,395,713 A | 7/1983 | Nelson et al. |
| 4,437,966 A | 3/1984 | Hope et al. |
| 4,442,144 A | 4/1984 | Pipkin |
| 4,467,236 A | 8/1984 | Kolm et al. |
| 4,481,265 A | 11/1984 | Ezawa et al. |
| 4,518,661 A | 5/1985 | Rippere |
| 4,555,456 A | 11/1985 | Kanehori et al. |
| 4,572,873 A | 2/1986 | Kanehori et al. |
| 4,587,225 A | 5/1986 | Tsukuma et al. |
| 4,619,680 A | 10/1986 | Nourshargh et al. |
| 4,645,726 A | 2/1987 | Hiratani et al. |
| 4,664,993 A | 5/1987 | Sturgis et al. |
| 4,668,593 A | 5/1987 | Sammells |
| RE32,449 E | 6/1987 | Claussen |
| 4,672,586 A | 6/1987 | Shimohigashi et al. |
| 4,710,940 A | 12/1987 | Sipes, Jr. |
| 4,728,588 A | 3/1988 | Noding et al. |
| 4,740,431 A | 4/1988 | Little |
| 4,756,717 A | 7/1988 | Sturgis et al. |
| 4,785,459 A | 11/1988 | Baer |
| 4,826,743 A | 5/1989 | Nazri |
| 4,865,428 A | 9/1989 | Corrigan |
| 4,878,094 A | 10/1989 | Balkanski |
| 4,903,326 A | 2/1990 | Zakman et al. |
| 4,915,810 A | 4/1990 | Kestigian et al. |
| 4,964,877 A | 10/1990 | Keister et al. |
| 4,977,007 A | 12/1990 | Kondo et al. |
| 4,978,437 A | 12/1990 | Wirz |
| 5,006,737 A | 4/1991 | Fay |
| 5,019,467 A | 5/1991 | Fujiwara |
| 5,030,331 A | 7/1991 | Sato |
| 5,035,965 A | 7/1991 | Sangyoji et al. |
| 5,055,704 A | 10/1991 | Link et al. |
| 5,057,385 A | 10/1991 | Hope et al. |
| 5,085,904 A | 2/1992 | Deak et al. |
| 5,096,852 A | 3/1992 | Hobson |
| 5,100,821 A | 3/1992 | Fay |
| 5,107,538 A | 4/1992 | Benton et al. |
| 5,110,694 A | 5/1992 | Nagasubramanian et al. |
| 5,110,696 A | 5/1992 | Shokoohi et al. |
| 5,119,269 A | 6/1992 | Nakayama |
| 5,119,460 A | 6/1992 | Bruce et al. |
| 5,124,782 A | 6/1992 | Hundt et al. |
| 5,147,985 A | 9/1992 | DuBrucq |
| 5,153,710 A | 10/1992 | McCain |
| 5,169,408 A | 12/1992 | Biggerstaff et al. |
| 5,171,413 A | 12/1992 | Arntz et al. |
| 5,173,271 A | 12/1992 | Chen et al. |
| 5,174,876 A | 12/1992 | Buchal et al. |
| 5,180,645 A | 1/1993 | Moré |
| 5,187,564 A | 2/1993 | McCain |
| 5,196,041 A | 3/1993 | Tumminelli et al. |
| 5,196,374 A | 3/1993 | Hundt et al. |
| 5,200,029 A | 4/1993 | Bruce et al. |
| 5,202,201 A | 4/1993 | Meunier et al. |
| 5,206,925 A | 4/1993 | Nakazawa et al. |
| 5,208,121 A | 5/1993 | Yahnke et al. |
| 5,217,828 A | 6/1993 | Sangyoji et al. |
| 5,221,891 A | 6/1993 | Janda et al. |
| 5,225,288 A | 7/1993 | Beeson et al. |
| 5,227,264 A | 7/1993 | Duval et al. |
| 5,237,439 A | 8/1993 | Misono et al. |
| 5,252,194 A | 10/1993 | Demaray et al. |
| 5,262,254 A | 11/1993 | Koksbang et al. |
| 5,273,608 A | 12/1993 | Nath |
| 5,287,427 A | 2/1994 | Atkins et al. |
| 5,296,089 A | 3/1994 | Chen et al. |
| 5,300,461 A | 4/1994 | Ting |
| 5,302,474 A | 4/1994 | Shackle |
| 5,303,319 A | 4/1994 | Ford et al. |
| 5,306,569 A | 4/1994 | Hiraki |
| 5,307,240 A | 4/1994 | McMahon |
| 5,309,302 A | 5/1994 | Vollmann |
| 5,314,765 A | 5/1994 | Bates |
| 5,326,652 A | 7/1994 | Lake |
| 5,326,653 A | 7/1994 | Chang |
| 5,338,624 A | 8/1994 | Gruenstern et al. |
| 5,338,625 A | 8/1994 | Bates et al. |
| 5,342,709 A | 8/1994 | Yahnke et al. |
| 5,355,089 A | 10/1994 | Treger et al. |
| 5,360,686 A | 11/1994 | Peled et al. |
| 5,362,579 A | 11/1994 | Rossoll et al. |
| 5,381,262 A | 1/1995 | Arima et al. |
| 5,387,482 A | 2/1995 | Anani |
| 5,401,595 A | 3/1995 | Kagawa et al. |
| 5,403,680 A | 4/1995 | Otagawa et al. |
| 5,411,537 A | 5/1995 | Munshi et al. |
| 5,411,592 A | 5/1995 | Ovshinsky et al. |
| 5,419,982 A | 5/1995 | Tura et al. |
| 5,427,669 A | 6/1995 | Drummond |
| 5,435,826 A | 7/1995 | Sakakibara et al. |
| 5,437,692 A | 8/1995 | Dasgupta et al. |
| 5,445,856 A | 8/1995 | Chaloner-Gill |
| 5,445,906 A | 8/1995 | Hobson et al. |
| 5,448,110 A | 9/1995 | Tuttle et al. |
| 5,449,576 A | 9/1995 | Anani |
| 5,455,126 A | 10/1995 | Bates et al. |
| 5,457,569 A | 10/1995 | Liou et al. |
| 5,458,995 A | 10/1995 | Behl et al. |
| 5,464,692 A | 11/1995 | Huber |
| 5,464,706 A | 11/1995 | Dasgupta et al. |
| 5,470,396 A | 11/1995 | Mongon et al. |
| 5,472,795 A | 12/1995 | Atita |
| 5,475,528 A | 12/1995 | LaBorde |
| 5,478,456 A | 12/1995 | Humpal et al. |
| 5,483,613 A | 1/1996 | Bruce et al. |
| 5,493,177 A | 2/1996 | Muller et al. |
| 5,498,489 A | 3/1996 | Dasgupta et al. |
| 5,499,207 A | 3/1996 | Miki et al. |
| 5,501,918 A | 3/1996 | Gruenstern et al. |
| 5,504,041 A | 4/1996 | Summerfelt |
| 5,512,147 A | 4/1996 | Bates et al. |
| 5,512,387 A | 4/1996 | Ovshinsky |
| 5,512,389 A | 4/1996 | Dasgupta et al. |
| 5,538,796 A | 7/1996 | Schaffer et al. |
| 5,540,742 A | 7/1996 | Sangyoji et al. |
| 5,547,780 A | 8/1996 | Kagawa et al. |
| 5,547,782 A | 8/1996 | Dasgupta et al. |
| 5,552,242 A | 9/1996 | Ovshinsky et al. |
| 5,555,127 A | 9/1996 | Abdelkader et al. |
| 5,561,004 A | 10/1996 | Bates et al. |
| 5,563,979 A | 10/1996 | Bruce et al. |
| 5,565,071 A | 10/1996 | Demaray et al. |
| 5,567,210 A | 10/1996 | Bates et al. |
| 5,569,520 A | 10/1996 | Bates |
| 5,582,935 A | 12/1996 | Dasgupta et al. |
| 5,591,520 A | 1/1997 | Migliorini et al. |
| 5,597,660 A | 1/1997 | Bates et al. |
| 5,597,661 A | 1/1997 | Takeuchi et al. |
| 5,599,355 A | 2/1997 | Nagasubramanian et al. |
| 5,601,952 A | 2/1997 | Dasgupta et al. |
| 5,603,816 A | 2/1997 | Demaray et al. |
| 5,607,560 A | 3/1997 | Hirabayashi et al. |
| 5,607,789 A | 3/1997 | Treger et al. |
| 5,612,152 A | 3/1997 | Bates et al. |
| 5,612,153 A | 3/1997 | Moulton et al. |
| 5,613,995 A | 3/1997 | Bhandarkar et al. |
| 5,616,933 A | 4/1997 | Li |
| 5,618,382 A | 4/1997 | Mintz et al. |
| 5,625,202 A | 4/1997 | Chai |
| 5,637,418 A | 6/1997 | Brown et al. |
| 5,643,480 A | 7/1997 | Gustavsson et al. |
| 5,644,207 A | 7/1997 | Lew et al. |
| 5,645,626 A | 7/1997 | Edlund et al. |
| 5,645,960 A | 7/1997 | Scrosati et al. |
| 5,654,054 A | 8/1997 | Tropsha et al. |
| 5,654,984 A | 8/1997 | Hershbarger et al. |
| 5,658,652 A | 8/1997 | Sellergren |
| 5,660,700 A | 8/1997 | Shimizu et al. |
| 5,665,490 A | 9/1997 | Takeuchi et al. |
| 5,667,538 A | 9/1997 | Bailey |
| 5,677,784 A | 10/1997 | Harris |
| 5,679,980 A | 10/1997 | Summerfelt |
| 5,681,666 A | 10/1997 | Treger et al. |

(56) References Cited

U.S. PATENT DOCUMENTS

| | | |
|---|---|---|
| 5,686,360 A | 11/1997 | Harvey, III et al. |
| 5,689,522 A | 11/1997 | Beach |
| 5,693,956 A | 12/1997 | Shi et al. |
| 5,702,829 A | 12/1997 | Paidassi et al. |
| 5,705,293 A | 1/1998 | Hobson |
| 5,716,728 A | 2/1998 | Smesko |
| 5,718,813 A | 2/1998 | Drummond et al. |
| 5,719,976 A | 2/1998 | Henry et al. |
| 5,721,067 A | 2/1998 | Jacobs et al. |
| RE35,746 E | 3/1998 | Lake |
| 5,731,661 A | 3/1998 | So et al. |
| 5,738,731 A | 4/1998 | Shindo et al. |
| 5,742,094 A | 4/1998 | Ting |
| 5,755,938 A | 5/1998 | Fukui et al. |
| 5,755,940 A | 5/1998 | Shindo |
| 5,757,126 A | 5/1998 | Harvey, III et al. |
| 5,762,768 A | 6/1998 | Goy et al. |
| 5,763,058 A | 6/1998 | Isen et al. |
| 5,771,562 A | 6/1998 | Harvey, III et al. |
| 5,776,278 A | 7/1998 | Tuttle et al. |
| 5,779,839 A | 7/1998 | Tuttle et al. |
| 5,790,489 A | 8/1998 | O'Connor |
| 5,792,550 A | 8/1998 | Phillips et al. |
| 5,805,223 A | 9/1998 | Shikakura et al. |
| 5,811,177 A | 9/1998 | Shi et al. |
| 5,814,195 A | 9/1998 | Lehan et al. |
| 5,830,330 A | 11/1998 | Lantsman |
| 5,831,262 A | 11/1998 | Greywall et al. |
| 5,834,137 A | 11/1998 | Zhang et al. |
| 5,841,931 A | 11/1998 | Foresi et al. |
| 5,842,118 A | 11/1998 | Wood, Jr. |
| 5,845,990 A | 12/1998 | Hymer |
| 5,847,865 A | 12/1998 | Gopinath et al. |
| 5,849,163 A | 12/1998 | Ichikawa et al. |
| 5,851,896 A | 12/1998 | Summerfelt |
| 5,853,830 A | 12/1998 | McCaulley et al. |
| 5,855,744 A | 1/1999 | Halsey et al. |
| 5,856,705 A | 1/1999 | Ting |
| 5,864,182 A | 1/1999 | Matsuzaki |
| 5,865,860 A | 2/1999 | Delnick |
| 5,870,273 A | 2/1999 | Sogabe et al. |
| 5,874,184 A | 2/1999 | Takeuchi et al. |
| 5,882,721 A | 3/1999 | Delnick |
| 5,882,946 A | 3/1999 | Otani |
| 5,889,383 A | 3/1999 | Teich |
| 5,895,731 A | 4/1999 | Clingempeel |
| 5,897,522 A | 4/1999 | Nitzan |
| 5,900,057 A | 5/1999 | Buchal et al. |
| 5,909,346 A | 6/1999 | Malhotra et al. |
| 5,916,704 A | 6/1999 | Lewin et al. |
| 5,923,964 A | 7/1999 | Li |
| 5,930,046 A | 7/1999 | Solberg et al. |
| 5,930,584 A | 7/1999 | Sun et al. |
| 5,942,089 A | 8/1999 | Sproul et al. |
| 5,948,215 A | 9/1999 | Lantsmann |
| 5,948,464 A | 9/1999 | Delnick |
| 5,948,562 A | 9/1999 | Fulcher et al. |
| 5,952,778 A | 9/1999 | Haskal et al. |
| 5,955,217 A | 9/1999 | Lerberghe |
| 5,961,672 A | 10/1999 | Skotheim et al. |
| 5,961,682 A | 10/1999 | Lee et al. |
| 5,966,491 A | 10/1999 | DiGiovanni |
| 5,970,393 A | 10/1999 | Khorrami et al. |
| 5,973,913 A | 10/1999 | McEwen et al. |
| 5,977,582 A | 11/1999 | Flemming et al. |
| 5,982,144 A | 11/1999 | Johnson et al. |
| 5,985,484 A | 11/1999 | Young et al. |
| 5,985,485 A | 11/1999 | Ovshinsky et al. |
| 6,000,603 A | 12/1999 | Koskenmaki et al. |
| 6,001,224 A | 12/1999 | Drummond et al. |
| 6,004,660 A | 12/1999 | Topolski et al. |
| 6,007,945 A | 12/1999 | Jacobs et al. |
| 6,013,949 A | 1/2000 | Tuttle |
| 6,019,284 A | 2/2000 | Freeman et al. |
| 6,023,610 A | 2/2000 | Wood, Jr. |
| 6,024,844 A | 2/2000 | Drummond et al. |
| 6,025,094 A | 2/2000 | Visco et al. |
| 6,028,990 A | 2/2000 | Shahani et al. |
| 6,030,421 A | 2/2000 | Gauthier et al. |
| 6,033,768 A | 3/2000 | Muenz et al. |
| 6,042,965 A | 3/2000 | Nestler et al. |
| 6,045,626 A | 4/2000 | Yano et al. |
| 6,045,652 A | 4/2000 | Tuttle et al. |
| 6,045,942 A | 4/2000 | Miekka et al. |
| 6,046,081 A | 4/2000 | Kuo |
| 6,046,514 A | 4/2000 | Rouillard et al. |
| 6,048,372 A | 4/2000 | Mangahara et al. |
| 6,051,114 A | 4/2000 | Yao et al. |
| 6,051,296 A | 4/2000 | McCaulley et al. |
| 6,052,397 A | 4/2000 | Jeon et al. |
| 6,057,557 A | 5/2000 | Ichikawa |
| 6,058,233 A | 5/2000 | Dragone |
| 6,071,323 A | 6/2000 | Kawaguchi |
| 6,075,973 A | 6/2000 | Greeff et al. |
| 6,077,106 A | 6/2000 | Mish |
| 6,077,642 A | 6/2000 | Ogata et al. |
| 6,078,791 A | 6/2000 | Tuttle et al. |
| 6,080,508 A | 6/2000 | Dasgupta et al. |
| 6,080,643 A | 6/2000 | Noguchi et al. |
| 6,093,944 A | 7/2000 | VanDover |
| 6,094,292 A | 7/2000 | Goldner et al. |
| 6,096,569 A | 8/2000 | Matsuno et al. |
| 6,100,108 A | 8/2000 | Mizuno et al. |
| 6,106,933 A | 8/2000 | Nagai et al. |
| 6,110,531 A | 8/2000 | Paz De Araujo |
| 6,115,616 A | 9/2000 | Halperin et al. |
| 6,117,279 A | 9/2000 | Smolanoff et al. |
| 6,118,426 A | 9/2000 | Albert et al. |
| 6,120,890 A | 9/2000 | Chen et al. |
| 6,129,277 A | 10/2000 | Grant et al. |
| 6,133,670 A | 10/2000 | Rodgers et al. |
| 6,137,671 A | 10/2000 | Staffiere |
| 6,144,916 A | 11/2000 | Wood, Jr. et al. |
| 6,146,225 A | 11/2000 | Sheats et al. |
| 6,148,503 A | 11/2000 | Delnick et al. |
| 6,156,452 A | 12/2000 | Kozuki et al. |
| 6,157,765 A | 12/2000 | Bruce et al. |
| 6,159,635 A | 12/2000 | Dasgupta et al. |
| 6,160,373 A | 12/2000 | Dunn et al. |
| 6,162,709 A | 12/2000 | Raoux et al. |
| 6,165,566 A | 12/2000 | Tropsha |
| 6,168,884 B1 | 1/2001 | Neudecker et al. |
| 6,169,474 B1 | 1/2001 | Greeff et al. |
| 6,175,075 B1 | 1/2001 | Shiotsuka et al. |
| 6,176,986 B1 | 1/2001 | Watanabe et al. |
| 6,181,283 B1 | 1/2001 | Johnson et al. |
| 6,192,222 B1 | 2/2001 | Greeff et al. |
| 6,197,167 B1 | 3/2001 | Tanaka |
| 6,198,217 B1 | 3/2001 | Suzuki et al. |
| 6,204,111 B1 | 3/2001 | Uemoto et al. |
| 6,210,544 B1 | 4/2001 | Sasaki |
| 6,210,832 B1 | 4/2001 | Visco et al. |
| 6,214,061 B1 | 4/2001 | Visco et al. |
| 6,214,660 B1 | 4/2001 | Uemoto et al. |
| 6,218,049 B1 | 4/2001 | Bates et al. |
| 6,220,516 B1 | 4/2001 | Tuttle et al. |
| 6,223,317 B1 | 4/2001 | Pax et al. |
| 6,228,532 B1 | 5/2001 | Tsuji et al. |
| 6,229,987 B1 | 5/2001 | Greeff et al. |
| 6,232,242 B1 | 5/2001 | Hata et al. |
| 6,235,432 B1 | 5/2001 | Kono et al. |
| 6,236,793 B1 | 5/2001 | Lawrence et al. |
| 6,242,128 B1 | 6/2001 | Tura et al. |
| 6,242,129 B1 | 6/2001 | Johnson |
| 6,242,132 B1 | 6/2001 | Neudecker et al. |
| 6,248,291 B1 | 6/2001 | Nakagama et al. |
| 6,248,481 B1 | 6/2001 | Visco et al. |
| 6,248,640 B1 | 6/2001 | Nam |
| 6,249,222 B1 | 6/2001 | Gehlot |
| 6,252,564 B1 | 6/2001 | Albert et al. |
| 6,258,252 B1 | 7/2001 | Miyasaka et al. |
| 6,261,917 B1 | 7/2001 | Quek et al. |
| 6,264,709 B1 | 7/2001 | Yoon et al. |
| 6,265,652 B1 | 7/2001 | Kurata et al. |

(56) References Cited

U.S. PATENT DOCUMENTS

| | | |
|---|---|---|
| 6,268,695 B1 | 7/2001 | Affinito |
| 6,271,053 B1 | 8/2001 | Kondo |
| 6,271,793 B1 | 8/2001 | Brady et al. |
| 6,271,801 B2 | 8/2001 | Tuttle et al. |
| 6,280,585 B1 | 8/2001 | Obinata |
| 6,280,875 B1 | 8/2001 | Kwak et al. |
| 6,281,142 B1 | 8/2001 | Basceri |
| 6,284,406 B1 | 9/2001 | Xing et al. |
| 6,287,986 B1 | 9/2001 | Mihara |
| 6,289,209 B1 | 9/2001 | Wood, Jr. |
| 6,290,821 B1 | 9/2001 | McLeod |
| 6,290,822 B1 | 9/2001 | Fleming et al. |
| 6,291,098 B1 | 9/2001 | Shibuya et al. |
| 6,294,722 B1 | 9/2001 | Kondo et al. |
| 6,296,949 B1 | 10/2001 | Bergstresser et al. |
| 6,296,967 B1 | 10/2001 | Jacobs et al. |
| 6,296,971 B1 | 10/2001 | Hara |
| 6,300,215 B1 | 10/2001 | Shin |
| 6,302,939 B1 | 10/2001 | Rabin |
| 6,306,265 B1 | 10/2001 | Fu et al. |
| 6,316,563 B2 | 11/2001 | Naijo et al. |
| 6,323,416 B1 | 11/2001 | Komori et al. |
| 6,324,211 B1 | 11/2001 | Ovard et al. |
| 6,325,294 B2 | 12/2001 | Tuttle et al. |
| 6,329,213 B1 | 12/2001 | Tuttle et al. |
| 6,339,236 B1 | 1/2002 | Tomii et al. |
| 6,340,880 B1 | 1/2002 | Higashijima et al. |
| 6,344,366 B1 | 2/2002 | Bates |
| 6,344,419 B1 | 2/2002 | Forster et al. |
| 6,344,795 B1 | 2/2002 | Gehlot |
| 6,350,353 B2 | 2/2002 | Gopalraja et al. |
| 6,351,630 B2 | 2/2002 | Wood, Jr. |
| 6,356,230 B1 | 3/2002 | Greeff et al. |
| 6,356,694 B1 | 3/2002 | Weber |
| 6,356,764 B1 | 3/2002 | Ovard et al. |
| 6,358,810 B1 | 3/2002 | Dornfest et al. |
| 6,360,954 B1 | 3/2002 | Barnardo |
| 6,361,662 B1 | 3/2002 | Chiba et al. |
| 6,365,300 B1 | 4/2002 | Ota et al. |
| 6,365,319 B1 | 4/2002 | Heath et al. |
| 6,368,275 B1 | 4/2002 | Sliwa et al. |
| 6,369,316 B1 | 4/2002 | Plessing et al. |
| 6,372,383 B1 | 4/2002 | Lee et al. |
| 6,372,386 B1 | 4/2002 | Cho et al. |
| 6,373,224 B1 | 4/2002 | Goto et al. |
| 6,375,780 B1 | 4/2002 | Tuttle et al. |
| 6,376,027 B1 | 4/2002 | Lee et al. |
| 6,379,835 B1 | 4/2002 | Kucherovsky et al. |
| 6,379,842 B1 | 4/2002 | Mayer |
| 6,379,846 B1 | 4/2002 | Terahara et al. |
| 6,380,477 B1 | 4/2002 | Curtin |
| 6,384,573 B1 | 5/2002 | Dunn |
| 6,387,563 B1 | 5/2002 | Bates |
| 6,391,166 B1 | 5/2002 | Wang |
| 6,392,565 B1 | 5/2002 | Brown |
| 6,394,598 B1 | 5/2002 | Kaiser |
| 6,395,430 B1 | 5/2002 | Cho et al. |
| 6,396,001 B1 | 5/2002 | Nakamura |
| 6,398,824 B1 | 6/2002 | Johnson |
| 6,399,241 B1 | 6/2002 | Hara et al. |
| 6,402,039 B1 | 6/2002 | Freeman et al. |
| 6,402,795 B1 | 6/2002 | Chu et al. |
| 6,402,796 B1 | 6/2002 | Johnson |
| 6,409,965 B1 | 6/2002 | Nagata et al. |
| 6,413,284 B1 | 7/2002 | Chu et al. |
| 6,413,285 B1 | 7/2002 | Chu et al. |
| 6,413,382 B1 | 7/2002 | Wang et al. |
| 6,413,645 B1 | 7/2002 | Graff et al. |
| 6,413,676 B1 | 7/2002 | Munshi |
| 6,414,626 B1 | 7/2002 | Greeff et al. |
| 6,416,598 B1 | 7/2002 | Sircar |
| 6,420,961 B1 | 7/2002 | Bates et al. |
| 6,422,698 B2 | 7/2002 | Kaiser |
| 6,423,106 B1 | 7/2002 | Bates |
| 6,423,776 B1 | 7/2002 | Akkapeddi et al. |
| 6,426,163 B1 | 7/2002 | Pasquier et al. |
| 6,432,577 B1 | 8/2002 | Shul et al. |
| 6,432,584 B1 | 8/2002 | Visco et al. |
| 6,433,380 B2 | 8/2002 | Shin |
| 6,433,465 B1 | 8/2002 | McKnight et al. |
| 6,436,156 B1 | 8/2002 | Wandeloski et al. |
| 6,437,231 B2 | 8/2002 | Kurata et al. |
| 6,444,336 B1 | 9/2002 | Jia et al. |
| 6,444,355 B1 | 9/2002 | Murai et al. |
| 6,444,368 B1 | 9/2002 | Hikmet et al. |
| 6,444,750 B1 | 9/2002 | Touhsaent |
| 6,459,418 B1 | 10/2002 | Comiskey et al. |
| 6,459,726 B1 | 10/2002 | Ovard et al. |
| 6,466,771 B2 | 10/2002 | Wood, Jr. |
| 6,475,668 B1 | 11/2002 | Hosokawa et al. |
| 6,480,699 B1 | 11/2002 | Lovoi |
| 6,481,623 B1 | 11/2002 | Grant et al. |
| 6,488,822 B1 | 12/2002 | Moslehi |
| 6,494,999 B1 | 12/2002 | Herrera et al. |
| 6,495,283 B1 | 12/2002 | Yoon et al. |
| 6,497,598 B2 | 12/2002 | Affinito |
| 6,500,287 B1 | 12/2002 | Azens et al. |
| 6,503,661 B1 | 1/2003 | Park et al. |
| 6,503,831 B2 | 1/2003 | Speakman |
| 6,506,289 B2 | 1/2003 | Demaray et al. |
| 6,511,516 B1 | 1/2003 | Johnson et al. |
| 6,511,615 B1 | 1/2003 | Dawes et al. |
| 6,517,968 B2 | 2/2003 | Johnson et al. |
| 6,522,067 B1 | 2/2003 | Graff et al. |
| 6,524,466 B1 | 2/2003 | Bonaventura et al. |
| 6,524,750 B1 | 2/2003 | Mansuetto |
| 6,525,976 B1 | 2/2003 | Johnson |
| 6,528,212 B1 | 3/2003 | Kusumoto et al. |
| 6,529,827 B1 | 3/2003 | Beason et al. |
| 6,533,907 B2 | 3/2003 | Demaray et al. |
| 6,537,428 B1 | 3/2003 | Xiong et al. |
| 6,538,211 B2 | 3/2003 | St. Lawrence et al. |
| 6,541,147 B1 | 4/2003 | McLean et al. |
| 6,548,912 B1 | 4/2003 | Graff et al. |
| 6,551,745 B2 | 4/2003 | Moutsios et al. |
| 6,558,836 B1 | 5/2003 | Whitacre et al. |
| 6,562,513 B1 | 5/2003 | Takeuchi et al. |
| 6,563,998 B1 | 5/2003 | Farah et al. |
| 6,569,564 B1 | 5/2003 | Lane |
| 6,569,570 B2 | 5/2003 | Sonobe et al. |
| 6,570,325 B2 | 5/2003 | Graff et al. |
| 6,572,173 B2 | 6/2003 | Muller |
| 6,573,652 B1 | 6/2003 | Graff et al. |
| 6,576,546 B2 | 6/2003 | Gilbert et al. |
| 6,579,728 B2 | 6/2003 | Grant et al. |
| 6,582,480 B2 | 6/2003 | Pasquier et al. |
| 6,582,481 B1 | 6/2003 | Erbil |
| 6,582,852 B1 | 6/2003 | Gao et al. |
| 6,589,299 B2 | 7/2003 | Missling et al. |
| 6,593,150 B2 | 7/2003 | Ramberg et al. |
| 6,599,662 B1 | 7/2003 | Chiang et al. |
| 6,600,905 B2 | 7/2003 | Greeff et al. |
| 6,602,338 B2 | 8/2003 | Chen et al. |
| 6,603,139 B1 | 8/2003 | Tessler et al. |
| 6,603,391 B1 | 8/2003 | Greeff et al. |
| 6,605,228 B1 | 8/2003 | Kawaguchi et al. |
| 6,608,464 B1 | 8/2003 | Lew et al. |
| 6,608,470 B1 | 8/2003 | Oglesbee et al. |
| 6,610,440 B1 | 8/2003 | LaFollette et al. |
| 6,615,614 B1 | 9/2003 | Makikawa et al. |
| 6,616,035 B2 | 9/2003 | Ehrensvard et al. |
| 6,618,829 B2 | 9/2003 | Pax et al. |
| 6,620,545 B2 | 9/2003 | Goenka et al. |
| 6,622,049 B2 | 9/2003 | Penner et al. |
| 6,632,563 B1 | 10/2003 | Krasnov et al. |
| 6,637,906 B2 | 10/2003 | Knoerzer et al. |
| 6,637,916 B2 | 10/2003 | Mullner |
| 6,639,578 B1 | 10/2003 | Comiskey et al. |
| 6,642,895 B2 | 11/2003 | Zurcher et al. |
| 6,645,675 B1 | 11/2003 | Munshi |
| 6,650,000 B2 | 11/2003 | Ballantine et al. |
| 6,650,942 B2 | 11/2003 | Howard et al. |
| 6,662,430 B2 | 12/2003 | Brady et al. |
| 6,664,006 B1 | 12/2003 | Munshi |

(56) References Cited

U.S. PATENT DOCUMENTS

| | | |
|---|---|---|
| 6,673,484 B2 | 1/2004 | Matsuura |
| 6,673,716 B1 | 1/2004 | D'Couto et al. |
| 6,674,159 B1 | 1/2004 | Peterson et al. |
| 6,677,070 B2 | 1/2004 | Kearl |
| 6,683,244 B2 | 1/2004 | Fujimori et al. |
| 6,683,749 B2 | 1/2004 | Daby et al. |
| 6,686,096 B1 | 2/2004 | Chung |
| 6,693,840 B2 | 2/2004 | Shimada et al. |
| 6,700,491 B2 | 3/2004 | Shafer |
| 6,706,449 B2 | 3/2004 | Mikhaylik et al. |
| 6,709,778 B2 | 3/2004 | Johnson |
| 6,713,216 B2 | 3/2004 | Kugai et al. |
| 6,713,389 B2 | 3/2004 | Speakman |
| 6,713,987 B2 | 3/2004 | Krasnov et al. |
| 6,723,140 B2 | 4/2004 | Chu et al. |
| 6,730,423 B2 | 5/2004 | Einhart et al. |
| 6,733,924 B1 | 5/2004 | Skotheim et al. |
| 6,737,197 B2 | 5/2004 | Chu et al. |
| 6,737,789 B2 | 5/2004 | Radziemski et al. |
| 6,741,178 B1 | 5/2004 | Tuttle |
| 6,750,156 B2 | 6/2004 | Le et al. |
| 6,752,842 B2 | 6/2004 | Luski et al. |
| 6,753,108 B1 | 6/2004 | Hampden-Smith et al. |
| 6,753,114 B2 | 6/2004 | Jacobs et al. |
| 6,760,520 B1 | 7/2004 | Medin et al. |
| 6,764,525 B1 | 7/2004 | Whitacre et al. |
| 6,768,246 B2 | 7/2004 | Pelrine et al. |
| 6,768,855 B1 | 7/2004 | Bakke et al. |
| 6,770,176 B2 | 8/2004 | Benson et al. |
| 6,773,848 B1 | 8/2004 | Nortoft et al. |
| 6,780,208 B2 | 8/2004 | Hopkins et al. |
| 6,797,428 B1 | 9/2004 | Skotheim et al. |
| 6,797,429 B1 | 9/2004 | Komatsu |
| 6,805,998 B2 | 10/2004 | Jenson et al. |
| 6,805,999 B2 | 10/2004 | Lee et al. |
| 6,818,356 B1 | 11/2004 | Bates |
| 6,822,157 B2 | 11/2004 | Fujioka |
| 6,824,922 B2 | 11/2004 | Park et al. |
| 6,827,826 B2 | 12/2004 | Demaray et al. |
| 6,828,063 B2 | 12/2004 | Park et al. |
| 6,828,065 B2 | 12/2004 | Munshi |
| 6,830,846 B2 | 12/2004 | Kramlich et al. |
| 6,835,493 B2 | 12/2004 | Zhang et al. |
| 6,838,209 B2 | 1/2005 | Langan et al. |
| 6,846,765 B2 | 1/2005 | Imamura et al. |
| 6,852,139 B2 | 2/2005 | Zhang et al. |
| 6,855,441 B1 | 2/2005 | Levanon |
| 6,861,821 B2 | 3/2005 | Masumoto et al. |
| 6,863,699 B1 | 3/2005 | Krasnov et al. |
| 6,866,901 B2 | 3/2005 | Burrows et al. |
| 6,866,963 B2 | 3/2005 | Seung et al. |
| 6,869,722 B2 | 3/2005 | Kearl |
| 6,884,327 B2 | 4/2005 | Pan et al. |
| 6,886,240 B2 | 5/2005 | Zhang et al. |
| 6,890,385 B2 | 5/2005 | Tsuchiya et al. |
| 6,896,992 B2 | 5/2005 | Kearl |
| 6,899,975 B2 | 5/2005 | Watanabe et al. |
| 6,902,660 B2 | 6/2005 | Lee et al. |
| 6,905,578 B1 | 6/2005 | Moslehi et al. |
| 6,906,436 B2 | 6/2005 | Jenson et al. |
| 6,911,667 B2 | 6/2005 | Pichler et al. |
| 6,916,679 B2 | 7/2005 | Snyder et al. |
| 6,921,464 B2 | 7/2005 | Krasnov et al. |
| 6,923,702 B2 | 8/2005 | Graff et al. |
| 6,924,164 B2 | 8/2005 | Jensen |
| 6,929,879 B2 | 8/2005 | Yamazaki |
| 6,936,377 B2 | 8/2005 | Wensley et al. |
| 6,936,381 B2 | 8/2005 | Skotheim et al. |
| 6,936,407 B2 | 8/2005 | Pichler |
| 6,949,389 B2 | 9/2005 | Pichler et al. |
| 6,955,986 B2 | 10/2005 | Li |
| 6,962,613 B2 | 11/2005 | Jenson |
| 6,962,671 B2 | 11/2005 | Martin et al. |
| 6,964,829 B2 | 11/2005 | Utsugi et al. |
| 6,982,132 B1 | 1/2006 | Goldner et al. |
| 6,986,965 B2 | 1/2006 | Jenson et al. |
| 6,994,933 B1 | 2/2006 | Bates |
| 7,022,431 B2 | 4/2006 | Shchori et al. |
| 7,033,406 B2 | 4/2006 | Weir et al. |
| 7,045,246 B2 | 5/2006 | Simburger et al. |
| 7,045,372 B2 | 5/2006 | Ballantine et al. |
| 7,056,620 B2 | 6/2006 | Krasnov et al. |
| 7,073,723 B2 | 7/2006 | Fürst et al. |
| 7,095,372 B2 | 8/2006 | Soler Castany et al. |
| 7,129,166 B2 | 10/2006 | Speakman |
| 7,131,189 B2 | 11/2006 | Jenson |
| 7,144,654 B2 | 12/2006 | LaFollette et al. |
| 7,144,655 B2 | 12/2006 | Jenson et al. |
| 7,157,187 B2 | 1/2007 | Jenson |
| 7,158,031 B2 | 1/2007 | Tuttle |
| 7,162,392 B2 | 1/2007 | Vock et al. |
| 7,183,693 B2 | 2/2007 | Brantner et al. |
| 7,186,479 B2 | 3/2007 | Krasnov et al. |
| 7,194,801 B2 | 3/2007 | Jenson et al. |
| 7,198,832 B2 | 4/2007 | Burrows et al. |
| 7,202,825 B2 | 4/2007 | Leizerovich et al. |
| 7,220,517 B2 | 5/2007 | Park et al. |
| 7,230,321 B2 | 6/2007 | McCain |
| 7,247,408 B2 | 7/2007 | Skotheim et al. |
| 7,253,494 B2 | 8/2007 | Mino et al. |
| 7,265,674 B2 | 9/2007 | Tuttle |
| 7,267,904 B2 | 9/2007 | Komatsu et al. |
| 7,267,906 B2 | 9/2007 | Mizuta et al. |
| 7,273,682 B2 | 9/2007 | Park et al. |
| 7,274,118 B2 | 9/2007 | Jenson et al. |
| 7,288,340 B2 | 10/2007 | Iwamoto |
| 7,316,867 B2 | 1/2008 | Park et al. |
| 7,323,634 B2 | 1/2008 | Speakman |
| 7,332,363 B2 | 2/2008 | Edwards |
| 7,335,441 B2 | 2/2008 | Luski et al. |
| RE40,137 E | 3/2008 | Tuttle et al. |
| 7,345,647 B1 | 3/2008 | Rodenbeck |
| 7,348,099 B2 | 3/2008 | Mukai et al. |
| 7,389,580 B2 | 6/2008 | Jenson et al. |
| 7,400,253 B2 | 7/2008 | Cohen |
| 7,410,730 B2 | 8/2008 | Bates |
| RE40,531 E | 10/2008 | Graff et al. |
| 7,466,274 B2 | 12/2008 | Lin et al. |
| 7,468,221 B2 | 12/2008 | LaFollette et al. |
| 7,494,742 B2 | 2/2009 | Tarnowski et al. |
| 7,670,724 B1 | 3/2010 | Chan et al. |
| 7,848,715 B2 | 12/2010 | Boos |
| 7,858,223 B2 | 12/2010 | Visco et al. |
| 8,010,048 B2 | 8/2011 | Brommer et al. |
| 8,056,814 B2 | 11/2011 | Martin et al. |
| 2001/0005561 A1 | 6/2001 | Yamada et al. |
| 2001/0027159 A1 | 10/2001 | Kaneyoshi |
| 2001/0031122 A1 | 10/2001 | Lackritz et al. |
| 2001/0032666 A1 | 10/2001 | Jenson et al. |
| 2001/0033952 A1 | 10/2001 | Jenson et al. |
| 2001/0034106 A1 | 10/2001 | Moise et al. |
| 2001/0041294 A1 | 11/2001 | Chu et al. |
| 2001/0041460 A1 | 11/2001 | Wiggins |
| 2001/0052752 A1 | 12/2001 | Ghosh et al. |
| 2001/0054437 A1 | 12/2001 | Komori et al. |
| 2001/0055719 A1 | 12/2001 | Akashi et al. |
| 2002/0000034 A1 | 1/2002 | Jenson |
| 2002/0001746 A1 | 1/2002 | Jenson |
| 2002/0001747 A1 | 1/2002 | Jenson |
| 2002/0004167 A1 | 1/2002 | Jenson et al. |
| 2002/0009630 A1 | 1/2002 | Gao et al. |
| 2002/0019296 A1 | 2/2002 | Freeman et al. |
| 2002/0028377 A1 | 3/2002 | Gross |
| 2002/0033330 A1 | 3/2002 | Demaray et al. |
| 2002/0037756 A1* | 3/2002 | Jacobs et al. ................ 455/572 |
| 2002/0066539 A1 | 6/2002 | Muller |
| 2002/0067615 A1 | 6/2002 | Muller |
| 2002/0071989 A1 | 6/2002 | Verma et al. |
| 2002/0076133 A1 | 6/2002 | Li et al. |
| 2002/0091929 A1 | 7/2002 | Ehrensvard |
| 2002/0093029 A1 | 7/2002 | Ballantine et al. |
| 2002/0106297 A1 | 8/2002 | Ueno et al. |
| 2002/0110733 A1 | 8/2002 | Johnson |
| 2002/0115252 A1 | 8/2002 | Haukka et al. |

(56) References Cited

U.S. PATENT DOCUMENTS

| | | |
|---|---|---|
| 2002/0134671 A1 | 9/2002 | Demaray et al. |
| 2002/0139662 A1 | 10/2002 | Lee |
| 2002/0140103 A1 | 10/2002 | Kloster et al. |
| 2002/0159245 A1 | 10/2002 | Murasko et al. |
| 2002/0161404 A1 | 10/2002 | Schmidt |
| 2002/0164441 A1 | 11/2002 | Amine et al. |
| 2002/0170821 A1 | 11/2002 | Sandlin et al. |
| 2002/0170960 A1 | 11/2002 | Ehrensvard et al. |
| 2003/0019326 A1 | 1/2003 | Han et al. |
| 2003/0022487 A1 | 1/2003 | Yoon et al. |
| 2003/0024994 A1 | 2/2003 | Ladyansky |
| 2003/0029493 A1 | 2/2003 | Plessing |
| 2003/0030589 A1 | 2/2003 | Zurcher et al. |
| 2003/0035906 A1 | 2/2003 | Memarian et al. |
| 2003/0036003 A1 | 2/2003 | Shchori et al. |
| 2003/0042131 A1 | 3/2003 | Johnson |
| 2003/0044665 A1 | 3/2003 | Rastegar et al. |
| 2003/0048635 A1 | 3/2003 | Knoerzer et al. |
| 2003/0063883 A1 | 4/2003 | Demaray et al. |
| 2003/0064292 A1 | 4/2003 | Neudecker et al. |
| 2003/0068559 A1 | 4/2003 | Armstrong et al. |
| 2003/0076642 A1 | 4/2003 | Shiner et al. |
| 2003/0077914 A1 | 4/2003 | Le et al. |
| 2003/0079838 A1 | 5/2003 | Brcka |
| 2003/0091904 A1 | 5/2003 | Munshi |
| 2003/0095463 A1 | 5/2003 | Shimada et al. |
| 2003/0097858 A1 | 5/2003 | Strohhofer et al. |
| 2003/0109903 A1 | 6/2003 | Berrang et al. |
| 2003/0127319 A1 | 7/2003 | Demaray et al. |
| 2003/0134054 A1 | 7/2003 | Demaray et al. |
| 2003/0141186 A1 | 7/2003 | Wang et al. |
| 2003/0143853 A1 | 7/2003 | Celii et al. |
| 2003/0146877 A1 | 8/2003 | Mueller |
| 2003/0152829 A1 | 8/2003 | Zhang et al. |
| 2003/0162094 A1 | 8/2003 | Lee et al. |
| 2003/0173207 A1 | 9/2003 | Zhang et al. |
| 2003/0173208 A1 | 9/2003 | Pan et al. |
| 2003/0174391 A1 | 9/2003 | Pan et al. |
| 2003/0175142 A1 | 9/2003 | Milonopoulou et al. |
| 2003/0178623 A1 | 9/2003 | Nishiki et al. |
| 2003/0178637 A1 | 9/2003 | Chen et al. |
| 2003/0180610 A1 | 9/2003 | Felde et al. |
| 2003/0185266 A1 | 10/2003 | Henrichs |
| 2003/0231106 A1 | 12/2003 | Shafer |
| 2003/0232248 A1 | 12/2003 | Iwamoto et al. |
| 2004/0008587 A1 | 1/2004 | Siebott et al. |
| 2004/0015735 A1 | 1/2004 | Norman |
| 2004/0023106 A1 | 2/2004 | Benson et al. |
| 2004/0028875 A1 | 2/2004 | Van Rijn et al. |
| 2004/0029311 A1 | 2/2004 | Snyder et al. |
| 2004/0038050 A1 | 2/2004 | Saijo et al. |
| 2004/0043557 A1 | 3/2004 | Haukka et al. |
| 2004/0048157 A1 | 3/2004 | Neudecker et al. |
| 2004/0058237 A1 | 3/2004 | Higuchi et al. |
| 2004/0072067 A1 | 4/2004 | Minami et al. |
| 2004/0077161 A1 | 4/2004 | Chen et al. |
| 2004/0078662 A1 | 4/2004 | Hamel et al. |
| 2004/0081415 A1 | 4/2004 | Demaray et al. |
| 2004/0081860 A1 | 4/2004 | Hundt et al. |
| 2004/0085002 A1 | 5/2004 | Pearce |
| 2004/0101761 A1 | 5/2004 | Park et al. |
| 2004/0105644 A1 | 6/2004 | Dawes |
| 2004/0106038 A1 | 6/2004 | Shimamura et al. |
| 2004/0106045 A1 | 6/2004 | Ugaji |
| 2004/0106046 A1 | 6/2004 | Inda |
| 2004/0118700 A1 | 6/2004 | Schierle-Arndt et al. |
| 2004/0126305 A1 | 7/2004 | Chen et al. |
| 2004/0151986 A1 | 8/2004 | Park et al. |
| 2004/0161640 A1 | 8/2004 | Salot |
| 2004/0175624 A1 | 9/2004 | Luski et al. |
| 2004/0188239 A1 | 9/2004 | Robison et al. |
| 2004/0209159 A1 | 10/2004 | Lee et al. |
| 2004/0212276 A1 | 10/2004 | Brantner et al. |
| 2004/0214079 A1 | 10/2004 | Simburger et al. |
| 2004/0219434 A1 | 11/2004 | Benson et al. |
| 2004/0245561 A1 | 12/2004 | Sakashita et al. |
| 2004/0258984 A1 | 12/2004 | Ariel et al. |
| 2004/0259305 A1 | 12/2004 | Demaray et al. |
| 2005/0000794 A1 | 1/2005 | Demaray et al. |
| 2005/0006768 A1 | 1/2005 | Narasimhan et al. |
| 2005/0048802 A1 | 3/2005 | Zhang et al. |
| 2005/0070097 A1 | 3/2005 | Barmak et al. |
| 2005/0072458 A1 | 4/2005 | Goldstein |
| 2005/0079418 A1 | 4/2005 | Kelley et al. |
| 2005/0095506 A1 | 5/2005 | Klaassen |
| 2005/0105231 A1 | 5/2005 | Hamel et al. |
| 2005/0110457 A1 | 5/2005 | LaFollette et al. |
| 2005/0112461 A1 | 5/2005 | Amine et al. |
| 2005/0118464 A1 | 6/2005 | Levanon |
| 2005/0130032 A1 | 6/2005 | Krasnov et al. |
| 2005/0133361 A1 | 6/2005 | Ding et al. |
| 2005/0141170 A1 | 6/2005 | Honda et al. |
| 2005/0142447 A1 | 6/2005 | Nakai et al. |
| 2005/0147877 A1 | 7/2005 | Tarnowski et al. |
| 2005/0158622 A1 | 7/2005 | Mizuta et al. |
| 2005/0170736 A1 | 8/2005 | Cok |
| 2005/0175891 A1 | 8/2005 | Kameyama et al. |
| 2005/0176181 A1 | 8/2005 | Burrows et al. |
| 2005/0181280 A1 | 8/2005 | Ceder et al. |
| 2005/0183946 A1 | 8/2005 | Pan et al. |
| 2005/0189139 A1 | 9/2005 | Stole |
| 2005/0208371 A1 | 9/2005 | Kim et al. |
| 2005/0239917 A1 | 10/2005 | Nelson et al. |
| 2005/0255828 A1 | 11/2005 | Fisher |
| 2005/0266161 A1 | 12/2005 | Medeiros et al. |
| 2006/0019504 A1 | 1/2006 | Taussig |
| 2006/0021214 A1 | 2/2006 | Jenson et al. |
| 2006/0021261 A1 | 2/2006 | Face |
| 2006/0040177 A1 | 2/2006 | Onodera et al. |
| 2006/0046907 A1 | 3/2006 | Rastegar et al. |
| 2006/0054496 A1 | 3/2006 | Zhang et al. |
| 2006/0057283 A1 | 3/2006 | Zhang et al. |
| 2006/0057304 A1 | 3/2006 | Zhang et al. |
| 2006/0063074 A1 | 3/2006 | Jenson et al. |
| 2006/0071592 A1 | 4/2006 | Narasimhan et al. |
| 2006/0155545 A1 | 7/2006 | Janye |
| 2006/0201583 A1 | 9/2006 | Michaluk et al. |
| 2006/0210779 A1 | 9/2006 | Weir et al. |
| 2006/0222954 A1 | 10/2006 | Skotheim et al. |
| 2006/0234130 A1 | 10/2006 | Inda |
| 2006/0237543 A1 | 10/2006 | Goto et al. |
| 2006/0255435 A1 | 11/2006 | Fuergut et al. |
| 2006/0286448 A1 | 12/2006 | Snyder et al. |
| 2007/0009802 A1 | 1/2007 | Lee et al. |
| 2007/0021156 A1 | 1/2007 | Hoong et al. |
| 2007/0023275 A1 | 2/2007 | Tanase et al. |
| 2007/0037058 A1 | 2/2007 | Visco et al. |
| 2007/0053139 A1 | 3/2007 | Zhang et al. |
| 2007/0087230 A1 | 4/2007 | Jenson et al. |
| 2007/0091543 A1 | 4/2007 | Gasse et al. |
| 2007/0125638 A1 | 6/2007 | Zhang et al. |
| 2007/0141468 A1 | 6/2007 | Barker |
| 2007/0148065 A1 | 6/2007 | Weir et al. |
| 2007/0148553 A1 | 6/2007 | Weppner |
| 2007/0151661 A1 | 7/2007 | Mao et al. |
| 2007/0164376 A1 | 7/2007 | Burrows et al. |
| 2007/0166612 A1 | 7/2007 | Krasnov et al. |
| 2007/0184345 A1 | 8/2007 | Neudecker et al. |
| 2007/0196682 A1 | 8/2007 | Visser et al. |
| 2007/0202395 A1 | 8/2007 | Snyder et al. |
| 2007/0205513 A1 | 9/2007 | Brunnbauer et al. |
| 2007/0210459 A1 | 9/2007 | Burrows et al. |
| 2007/0222681 A1 | 9/2007 | Greene et al. |
| 2007/0224951 A1 | 9/2007 | Gilb et al. |
| 2007/0229228 A1 | 10/2007 | Yamazaki et al. |
| 2007/0235320 A1 | 10/2007 | White et al. |
| 2007/0264564 A1* | 11/2007 | Johnson et al. .............. 429/161 |
| 2007/0278653 A1 | 12/2007 | Brunnbauer et al. |
| 2007/0298326 A1 | 12/2007 | Angell et al. |
| 2008/0003496 A1 | 1/2008 | Neudecker et al. |
| 2008/0008936 A1 | 1/2008 | Mizuta et al. |
| 2008/0014501 A1 | 1/2008 | Skotheim et al. |
| 2008/0057397 A1 | 3/2008 | Skotheim et al. |
| 2008/0150829 A1 | 6/2008 | Lin et al. |

(56) References Cited

U.S. PATENT DOCUMENTS

| | | |
|---|---|---|
| 2008/0213672 A1 | 9/2008 | Skotheim et al. |
| 2008/0233708 A1 | 9/2008 | Hisamatsu |
| 2008/0254575 A1 | 10/2008 | Fuergut et al. |
| 2008/0261107 A1 | 10/2008 | Snyder et al. |
| 2008/0263855 A1 | 10/2008 | Li et al. |
| 2008/0286651 A1 | 11/2008 | Neudecker et al. |
| 2009/0092903 A1 | 4/2009 | Johnson et al. |
| 2009/0124201 A1 | 5/2009 | Meskens |
| 2009/0181303 A1 | 7/2009 | Neudecker et al. |
| 2009/0302226 A1 | 12/2009 | Schieber et al. |
| 2009/0308936 A1 | 12/2009 | Nitzan et al. |
| 2009/0312069 A1 | 12/2009 | Peng et al. |
| 2010/0001079 A1 | 1/2010 | Martin et al. |
| 2010/0032001 A1 | 2/2010 | Brantner |
| 2010/0086853 A1 | 4/2010 | Venkatachalam et al. |
| 2011/0267235 A1 | 11/2011 | Brommer et al. |
| 2011/0304430 A1 | 12/2011 | Brommer et al. |

FOREIGN PATENT DOCUMENTS

| | | |
|---|---|---|
| DE | 19824145 | 12/1999 |
| DE | 10 2005 014 427 | 9/2006 |
| DE | 10 2006 054 309 | 11/2006 |
| DE | 10 2008 016 665 | 10/2008 |
| DE | 10 2007 030604 | 1/2009 |
| EP | 0 510 883 | 10/1992 |
| EP | 0 639 655 | 2/1995 |
| EP | 0 652 308 | 5/1995 |
| EP | 0 820 088 | 1/1998 |
| EP | 1 068 899 | 1/2001 |
| EP | 0 867 985 | 2/2001 |
| EP | 1 092 689 | 4/2001 |
| EP | 1 189 080 | 3/2002 |
| EP | 1 713 024 | 10/2006 |
| FR | 2 861 218 | 4/2005 |
| FR | 2806198 | 9/2011 |
| JP | 55-009305 | 1/1980 |
| JP | 56-076060 | 6/1981 |
| JP | 56-156675 | 12/1981 |
| JP | 60-068558 | 4/1985 |
| JP | 61-269072 | 11/1986 |
| JP | 62-267944 | 11/1987 |
| JP | 63-290922 | 11/1988 |
| JP | 2000-162234 | 11/1988 |
| JP | 2-054764 | 2/1990 |
| JP | 2-230662 | 9/1990 |
| JP | 03-036962 | 2/1991 |
| JP | 4-058456 | 2/1992 |
| JP | 4-072049 | 3/1992 |
| JP | 6-010127 | 1/1994 |
| JP | 6-100333 | 4/1994 |
| JP | 7-233469 | 5/1995 |
| JP | 7-224379 | 8/1995 |
| JP | 08-114408 | 5/1996 |
| JP | 10-026571 | 1/1998 |
| JP | 10-239187 | 9/1998 |
| JP | 11-204088 | 7/1999 |
| JP | 2000-144435 | 5/2000 |
| JP | 2000-188099 | 7/2000 |
| JP | 2000-268867 | 9/2000 |
| JP | 2001-171812 | 6/2001 |
| JP | 2001-259494 | 9/2001 |
| JP | 2001-297764 | 10/2001 |
| JP | 2001-328198 | 11/2001 |
| JP | 2002-140776 | 5/2002 |
| JP | 2002-344115 | 11/2002 |
| JP | 2003-17040 | 1/2003 |
| JP | 2003-347045 | 12/2003 |
| JP | 2004-071305 | 3/2004 |
| JP | 2004-149849 | 5/2004 |
| JP | 2004-158268 | 6/2004 |
| JP | 2004-273436 | 9/2004 |
| JP | 2005-256101 | 9/2005 |
| JP | 2002-026412 | 2/2007 |
| JP | 7-107752 | 4/2007 |
| KR | 20020007881 | 1/2002 |
| KR | 20020017790 | 3/2002 |
| KR | 20020029813 | 4/2002 |
| KR | 20020038917 | 5/2002 |
| KR | 20030033913 | 5/2003 |
| KR | 20030042288 | 5/2003 |
| KR | 20030085252 | 11/2003 |
| RU | 2241281 | 11/2004 |
| WO | WO 9513629 | 5/1995 |
| WO | WO 9623085 | 8/1996 |
| WO | WO 9623217 | 8/1996 |
| WO | WO 9727344 | 7/1997 |
| WO | WO 9735044 | 9/1997 |
| WO | WO 9847196 | 10/1998 |
| WO | WO 9943034 | 8/1999 |
| WO | WO 9957770 | 11/1999 |
| WO | WO 0021898 | 4/2000 |
| WO | WO 0022742 | 4/2000 |
| WO | WO 0028607 | 5/2000 |
| WO | WO 0036665 | 6/2000 |
| WO | WO 0060682 | 10/2000 |
| WO | WO 0060689 | 10/2000 |
| WO | WO 0062365 | 10/2000 |
| WO | WO 0101507 | 1/2001 |
| WO | WO 0117052 | 3/2001 |
| WO | WO 0124303 | 4/2001 |
| WO | WO 0133651 | 5/2001 |
| WO | WO 0139305 | 5/2001 |
| WO | WO 0173864 | 10/2001 |
| WO | WO 0173865 | 10/2001 |
| WO | WO 0173866 | 10/2001 |
| WO | WO 0173868 | 10/2001 |
| WO | WO 0173870 | 10/2001 |
| WO | WO 0173883 | 10/2001 |
| WO | WO 0173957 | 10/2001 |
| WO | WO 0182390 | 11/2001 |
| WO | WO 0212932 | 2/2002 |
| WO | WO 0242516 | 5/2002 |
| WO | WO 0247187 | 6/2002 |
| WO | WO 02071506 | 9/2002 |
| WO | WO 02101857 | 12/2002 |
| WO | WO 03003485 | 1/2003 |
| WO | WO 03005477 | 1/2003 |
| WO | WO 03026039 | 3/2003 |
| WO | WO 03036670 | 5/2003 |
| WO | WO 03069714 | 8/2003 |
| WO | WO 03080325 | 10/2003 |
| WO | WO 03083166 | 10/2003 |
| WO | WO 2004012283 | 2/2004 |
| WO | WO 2004021532 | 3/2004 |
| WO | WO 2004061887 | 7/2004 |
| WO | WO 2004077519 | 9/2004 |
| WO | WO 2004086550 | 10/2004 |
| WO | WO 2004093223 | 10/2004 |
| WO | WO 2004106581 | 12/2004 |
| WO | WO 2004106582 | 12/2004 |
| WO | WO 2005008828 | 1/2005 |
| WO | WO 2005013394 | 2/2005 |
| WO | WO 2005038957 | 4/2005 |
| WO | WO 2005067645 | 7/2005 |
| WO | WO 2005085138 | 9/2005 |
| WO | WO 2005091405 | 9/2005 |
| WO | WO 2006063308 | 6/2006 |
| WO | WO 2006085307 | 8/2006 |
| WO | WO 2007016781 | 2/2007 |
| WO | WO 2007019855 | 2/2007 |
| WO | WO 2007095604 | 8/2007 |
| WO | WO 2008036731 | 3/2008 |

OTHER PUBLICATIONS

Guy, D., "Novel Architecture of Composite Electrode for Optimization of Lithium Battery Performance," Journal of Power Sources 157, pp. 438-442 (2006).

Wolfenstine, J., "Electrical Conductivity and Charge Compensation in Ta Doped $Li_4Ti_5O_{12}$," Journal of Power Sources 180, pp. 582-585 (2008).

(56) References Cited

OTHER PUBLICATIONS

Balanis, Constantine A., "Antenna Theory: Analysis and Design," 3rd Ed., pp. 811-820 (2005).
Jones and Akridge, "A thin film solid state microbattery," Solid State Ionics 53-56 (1992), pp. 628-634.
Hill, R. et al., "Large Area Deposition by Mid-Frequency AC Sputtering," Society of Vacuum Coaters, 41st Annual Tech. Conference Proceedings, 197-202 (1998).
Macák, Karol et al, "Ionized Sputter Deposition Using an Extremely High Plasma Density Pulsed Magnetron Discharge," J. Vac. Sci. Technol. A 18(4):1533-37 (2000).
Balanis, Constantine A., "Antenna Theory: Analysis and Design," 3rd Ed., pp. 817-820 (John Wiley & Sons, Inc. Publication, 2005).
Abraham, K.M. et al., "Inorganic-organic composite solid polymer electrolytes," 147(4) J. Electrochem. Soc. 1251-56 (2000).
Abrahams, I., "$Li_6Zr_2O_7$, a new anion vacancy ccp based structure, determined by ab initio powder diffraction methods," 104 J. Solid State Chem. 397-403 (1993).
Affinito, J.D. et al., "PML/oxide/PML barrier layer performance differences arising from use of UV or electron beam polymerization of the PML layers," Thin Solid Films 308-309: 19-25 (1997).
Affinito, J.D. et al., "Polymer-oxide transparent barrier layers," Society of Vacuum Coaters, 39th Ann. Technical Conference Proceedings, May 5-10, 1996, Philadelphia, PA, pp. 392-397 (1996).
Alder, T. et al., "High-efficiency fiber-to-chip coupling using low-loss tapered single-mode fiber," IEEE Photonics Tech. Lett. 12(8): 1016-1018 (2000).
Almeida, V.R. et al., "Nanotaper for compact mode conversion," Optics Letters 28(15): 1302-1304 (2003).
Amatucci, G. et al., "Lithium scandium phosphate-based electrolytes for solid state lithium rechargeable microbatteries," 60 Solid State Ionics 357-65 (1993).
Anh et al., "Significant Suppression of Leakage Current in $(Ba,Sr)TiO_3$ Thin Films by Ni or Mn Doping," J. Appl. Phys.,92(5): 2651-2654 (Sep. 2002).
Appetecchi, G.B. et al., "Composite polymer electrolytes with improved lithium metal electrode interfacial properties," 145(12) J. Electrochem. Soc. 4126-32 (1998).
Asghari, M. and Dawnay, E., "ASOC™—a manufacturing integrated optics technology," SPIE 3620: 252-262 (Jan. 1999).
Barbier, D. et al., "Amplifying four-wavelength combiner, based on erbium/ytterbium-doped waveguide amplifiers and integrated splitters," IEEE Photonics Tech. Lett. 9:315-317 (1997).
Barbier, D., "Performances and potential applications of erbium doped planar waveguide amplifiers and lasers," Proc. OAA, Victoria, BC, Canada, pp. 58-63 (Jul. 21-23, 1997).
Bates et al., "Thin-Film Lithium Batteries" in New Trends in Electrochemical Technology: Energy Storage Systems for Electronics (T. Osaka & M. Datta eds. Gordon and Breach 2000).
Bates, J.B. et al., "Electrical properties of amorphous lithium electrolyte thin films," 53-56 Solid State Ionics 647-54 (1992).
Beach R.J., "Theory and optimization of lens ducts," Applied Optics 35(12): 2005-2015 (1996).
Belkind, A. et al., "Pulsed-DC Reactive Sputtering of Dielectrics: Pulsing Parameter Effects," 43rd Annual Technical Conference Proceedings (2000).
Belkind, A. et al., "Using pulsed direct current power for reactive sputtering of $Al_2O_3$," J. Vac. Sci. Technol. A 17(4): 1934-1940 (1999).
Bestwick, T., "ASOC™ silicon integrated optics technology," SPIE 3631: 182-190 (1999).
Borsella, E. et al., "Structural incorporation of silver in soda-lime glass by the ion-exchange process: a photoluminescence spectroscopy study," Applied Physics A 71: 125-132 (2000).
Byer, R.L., "Nonlinear optics and solid-state lasers: 2000," IEEE J. Selected Topics in Quantum Electronics 6(6): 911-930 (2000).
Campbell, S.A. et al., "Titanium dioxide (TiO2)-based gate insulators," IBM J. Res. Develop. 43(3): 383-392 (1999).
Chang, C.Y. and Sze, S.M. (eds.), in ULSI Technology, The McGraw-Hill Companies, Inc., New York, Chapter 4, pp. 169-170 and 226-231 (1996).
Chen, G. et al., "Development of supported bifunctional electrocatalysts for unitized regenerative fuel cells," J. Electrochemical Society 149(8): A1092-A1099 (2002).
Choi, Y.B. et al., "Er-Al-codoped silicate planar light waveguide-type amplifier fabricated by radio-frequency sputtering," Optics Letters 25(4): 263-265 (2000).
Choy et al., "Eu-Doped Y2O3 Phosphor Films Produced by Electrostatic-Assisted Chemical Vapor Deposition," J. Mater. Res. 14(7): 3111-3114 (Jul. 1999).
Cocorullo, G. et al., "Amorphous silicon waveguides and light modulators for integrated photonics realized by low-temperature plasma-enhanced chemical-vapor deposition," Optics Lett. 21(24): 2002-2004 (1996).
Cooksey, K. et al., "Predicting permeability & Transmission rate for multilayer materials," Food Technology 53(9): 60-63 (1999).
Crowder, M.A. et al., "Low-temperature single-crystal Si TFT's fabricated on Si films processed via sequential lateral solidification," IEEE Electron Device Lett. 19(8): 306-308 (1998).
Delavaux, J-M. et al., "Integrated optics erbium ytterbium amplifier system in 10Gb/s fiber transmission experiment," 22nd European Conference on Optical Communication, Osla, I.123-I.126 (1996).
Delmas, C. et al., "Des conducteurs ioniques pseudo-bidimensionnels $Li_8MO_6$ (M = Zr, Sn), $Li_7LO_6$ (L =Nb, Ta) et $Li_6In_2O_6$," 14 Mat. Res. Bull. 619-25 (1979).
Distributed Energy Resources: Fuel Cells, Projects, 4 pages http://www.eere.energy.gov/der/fuel_cells/projects.html (2003).
Dorey, R.A., "Low temperature micromoulding of functional ceramic devices," Grant summary for GR/S84156/01 for the UK Engineering and Physical Sciences Research Council, 2 pages (2004).
DuPont Teijin Films, Mylar 200 SBL 300, Product Information, 4 pages (2000).
Electrometals Technologies Limited, Financial Report for 2002, Corporate Directory, Chairman's review, Review of Operations, 10 pages (2002).
E-Tek website: FAQ, Inside E-Tek, E-TEk News, Products; http://www.etek-inc.com/, 10 pages (2003).
Flytzanis, C. et al., "Nonlinear optics in composite materials," in Progress in Optics XXIX, Elsevier Science Publishers B.V., pp. 323-425 (1991).
Frazao, O. et al., "EDFA gain flattening using long-period fibre gratings based on the electric arc technique," Proc. London Comm. Symp. 2001, London, England, 3 pages (2001).
Fujii, M. et al., "1.54 μm photoluminescence of $Er^{3+}$ doped into $SiO_2$ films containing Si nanocrystals: evidence for energy transfer from Si nanocrystals for $Er^{3+}$," Appl. Phys. Lett. 71(9):1198-1200 (1997).
Garcia, C. et al., "Size dependence of lifetime and absorption cross section of Si nanocrystals embedded in $SiO_2$," Appl. Phys. Lett. 82(10): 1595-1597 (2003).
Goossens, A. et al., "Sensitization of $TiO_2$ with p-type semiconductor polymers," Chem. Phys. Lett. 287: 148 (1998).
Greene, J.E. et al., "Morphological and electrical properties of rf sputtered $Y_2O_3$-doped $ZrO_2$ thin films," J. Vac. Sci. Tech. 13(1): 72-75 (1976).
Han, H.-S. et al., "Optical gain at 1.54 μm in Erbium-doped Silicon nanocluster sensitized waveguide," Appl. Phys. Lett. 79(27): 4568-4570 (2001).
Hayakawa, T. et al., "Enhanced fluorescence from $Eu^{3+}$ owing to surface plasma oscillation of silver particles in glass," J. Non-Crystalline Solids 259: 16-22 (1999).
Hayakawa, T. et al., "Field enhancement effect of small Ag particles on the fluorescence from $Eu^{3+}$-doped $SiO_2$ glass," Appl. Phys. Lett. 74(11): 1513-1515 (1999).
Hayfield, P.C.S., I Development of a New Material-Monolithic $Ti_4O_7$ Ebonix® Ceramic, Royal Society of Chemistry, Cambridge, Table of Contents, 4 pages (2002).
Hehlen, M.P. et al., "Spectroscopic properties of $Er^{3+}$- and $Yb^{3+}$-doped soda-lime silicate and aluminosilicate glasses," Physical Review B 56(15): 9302-9318 (1997).

(56) References Cited

OTHER PUBLICATIONS

Hehlen, M.P. et al., "Uniform upconversion in high-concentration $Er^{3+}$-doped soda lime silicate and aluminosilicate glasses," Optics Letters 22(11); 772-774 (1997).
Horst, F. et al., "Compact, tunable optical devices in silicon-oxynitride waveguide technology," Top. Meeting Integrated Photonics Res. '00, Quebec, Canada, p. IThF1, 3 pages (2000).
Howson, R.P., "The reactive sputtering of oxides and nitrides," Pure & Appl. Chem. 66(6): 1311-1318 (1994).
Hu, Y-W. et al., "Ionic conductivity of lithium phosphate-doped lithium orthosilicate," 11 Mat. Res. Bull. 1227-30 (1976).
Hubner, J. And Guldberg-Kjaer, S., "Planar Er- and Yb-doped amplifiers and lasers," COM Technical University of Denmark, 10th European Conf. on Integrated Optics, Session WeB2, pp. 71-74 (2001).
Hwang et al., "Characterization of sputter-deposited LiMn2O4 thin films for rechargeable microbatteries," 141(12) J. Electrochem. Soc. 3296-99 (1994).
Hwang, M-S. et al., "The effect of pulsed magnetron sputtering on the properties of iridium tin oxide thin films," Surface and Coatings Tech. 171: 29-33 (2003).
Im, J.S. and Sposili, R.S., "Crystalline Si films for integrated active-matrix liquid crystal displays," MRS Bulletin, pp. 39-48 (1996).
Im, J.S. et al., "Controlled super-lateral growth of Si-films for microstructural manipulation and optimization," Physica Status Solidi (A) 166(2): 603-617 (1998).
Im, J.S. et al., "Single-crystal Si films for thin-film transistor devices," Appl. Physics Lett. 70(25): 3434-3436 (1997).
Itoh, M. et al., "Large reduction of singlemode-fibre coupling loss in 1.5% Δ a planar lightwave circuits using spot-size converters," Electronics Letters 38(2): 72-74 (2002).
Jackson, M.K. and Movassaghi, M., "An accurate compact EFA model," Eur. Conf. Optical Comm., Munich, Germany, 2 pages (2000).
Janssen, R. et al., "Photoinduced electron transfer from conjugated polymers onto nanocrystalline $TiO_2$," Synthet. Metal., 1 page (1999).
Johnson, J.E. et al., "Monolithically integrated semiconductor optical amplifier and electroabsorption modulator with dual-waveguide spot-size converter input," IEEE J. Selected topics in Quantum Electronics 6(1): 19-25 (2000).
Jones et al., "A Thin Film Solid State Microbattery" 53-56 Solid State Ionics 628 (1992).
Jonsson, L.B. et al., "Frequency response in pulsed DC reactive sputtering processes," Thin Solid Films 365: 43-48 (2000).
Kato, K. And Inoue, Y., "Recent progress on PLC hybrid integration," SPIE 3631: 28-36 (1999).
Kato, K. And Tohmori, Y., "PLC hybrid integration technology and its application to photonic components," IEEE J. Selected Topics in Quantum Electronics 6(1): 4-13 (2000).
Kelly, P.J. and Arnell, R.D., "Control of the structure and properties of aluminum oxide coatings deposited by pulsed magnetron sputtering," J. Vac. Sci. Technol. A 17(3): 945-953 (1999).
Kelly, P.J. et al., "A novel technique for the deposition of aluminum-doped zinc oxide films," Thin Solid Films 426(1-2): 111-116 (2003).
Kelly, P.J. et al., "Reactive pulsed magnetron sputtering process for alumina films," J. Vac. Sci. Technol. A 18(6): 2890-2896 (2000).
Kik, P.G. And Polman, A., "Gain limiting processes in Er-doped Si nanocrystal waveguides in $SiO_2$," J. Appl. Phys. 91(1): 536-536 (2002).
Kim et al., "Correlation Between the Microstructures and the Cycling Performance of $RuO_2$ Electrodes for Thin-Film Microsupercapacitros," J. Vac. Sci. Technol. B20(5): 1827-1832 (Sep. 2002).
Kim, D-W. et al. "Mixture Behavior and Microwave Dielectric Properties in the Low-fired $TiO_2$- CuO System," Jpn. J. Appl. Phys. 39:2696-2700 (2000).
Kim, H-K. et al., "Characteristics of rapid-thermal-annealed LiCoO2 cathode film for an all-solid-state thin film microbattery," J. Vac. Sci. Technol. A 22(4): 1182-1187 (2004).

Kim, J-Y. et al. "Frequency-dependent pulsed direct current magnetron sputtering of titanium oxide films," J. Vac. Sci. Technol. A 19(2):429-434 (2001).
Ladouceur, F. And Love, J.D., in: Silica-based Buried Channel Waveguides and Devices, Chapman & Hall, London, Table of Contents, 6 pages (1996).
Ladouceur, F. et al., "Effect of side wall roughness in buried channel waveguides," IEEE Proc. Optoelectron. 141(4):242-248 (1994).
Lamb, W. and Zeiler, R., Designing Non-Foil Containing Skins for Vacuum Insulation Panel (VIP) Application, Vuoto XXVIII(1-2):55-58 (1999).
Von Rottkay, K. et al., "Influences of stoichiometry on electrochromic cerium-titanium oxide compounds," Presented at the 11th Int'l Conference of Solid State Ionics, Honolulu, Hawaii, Nov. 19, 1997, Published in Solid State Ionics 113-115:425-430. (1998).
Wang, B. et al., "Characterization of Thin-Film Rechargeable Lithium Batteries with Lithium Cobalt Oxide Cathodes," J. Electrochem. Soc. 143:3203-13 (1996).
Westlinder, J. et al., "Simulation and Dielectric Characterization of Reactive dc Magnetron Cosputtered $(Ta_2O_5)_{1-x}(TiO_2)$ Thin Films," J Vac. Sci. Technol. B 20(3):855-861 (May/Jun. 2002).
Wilkes, K.E., "Gas Permeation Through Vacuum Barrier Films and its Effect on VIP Thermal Performance," presented at the Vacuum Insulation Panel Symp., Baltimore, Maryland, 21 pages (May 3, 1999).
Yanagawa, H. et al., "Index-and-Dimensional Taper and Its Application to Photonic Devices," J. Lightwave Technology 10(5):587-591 (1992).
Yoshikawa, K. et al., "Spray formed aluminum alloys for sputtering targets," Powder Metallurgy 43(3): 198-199 (2000).
Yu, X. et al., "A stable thin-film lithium electrolyte: lithium phosphorus oxynitride," 144(2) J. Electrochem. Soc. 524-532 (1997).
Zhang, H. et al., "High Dielectric Strength, High k $TiO_2$ Films by Pulsed DC, Reactive Sputter Deposition," 5 pages (2001).
Lamb, W.B., "Designing Nonfoil Containing Skins for VIP Applications," DuPont VIA Symposium Presentation, 35 Pages (1999).
Lange, M.R. et al, "High Gain Ultra-Short Length Phosphate glass Erbium-Doped Fiber Amplifier Material," OSA Optical Fiber Communications (OFC), 3 pages (2002).
Laporta, P. et al, "Diode-pumped cw bulk Er: Yb: glass laser," Optics Letters 16(24):1952-1954 (1991).
Laurent-Lund, C. et al., "PECVD Grown Multiple Core Planar Waveguides with Extremely Low Interface Reflections and Losses," IEEE Photonics Tech. Lett. 10(10):1431-1433 (1998).
Lee, B.H. et al., "Effects of interfacial layer growth on the electrical characteristics of thin titanium oxide films on silion," Appl. Phys. Lett. 74(21):3143-3145 (1999).
Lee, K.K. et al., "Effect of size and roughness on light transmission in a $Si/SiO_2$ waveguide: Experiments and model," Appl. Phys. Lett. 77(11):1617-1619 (2000).
Love, J.D. et al., "Quantifying Loss Minimisation in Single-Mode Fibre Tapers," Electronics Letters 22(17):912-914 (1986).
Mardare, D. and Rusu, G.I., "On the structure of Titanium Oxide Thin Films," Andalele Stiintifice Ale Universitatii IASI, Romania, pp. 201-208 (1999).
Marques, P.V.S. et al., "Planar Silica-on-Silicon Waveguide Lasers Based in Two Layers Core Devices," 10th European Conference on Integrated Optics, Session WeB2, pp. 79-82 (2001).
Mattox "Handbook of Physical Vapor Deposition (PVD) Processing, Society of Vacuum Coaters," Albuquerque, New Mexico 660f and 692ff, Noyes Publications (1998).
Meijerink, A. et al., "Luminescence of $Ag^+$, in Crystalline and Glassy $Srb_4O_7$," J. Physics Chem. Solids 54(8):901-906 (1993).
Mesnaoui, M. et al., "Spectroscopic properties of $Ag^+$ ions in phosphate glasses of $NaPO_3$—$AgPO_3$ system," Eur. J. Solid State Inorg. Chem. 29:1001-1013 (1992).
Mitomi, O. et al., "Design of a Single-Mode Tapered Waveguide for Low-Loss Chip-to-Fiber Coupling," IEEE J. Quantum Electronics 30(8): 1787-1793 (1994).
Mizuno, Y. et al "Temperature dependence of oxide decomposition on titanium surfaces in UHV," J. Vac. Sci & Tech. A. 20(5): 1716-1721 (2002).

(56) References Cited

OTHER PUBLICATIONS

Neudecker, B. et al., "$Li_9SiAlO_8$: a lithium ion electrolyte for voltages above 5.4 V," 143(7) J. Electrochem. Soc. 2198-203 (1996).
Ohkubo, H. at al., Polarization-Insensitive Arrayed-Waveguide Grating Using Pure $SiO_2$ Cladding, Fifth Optoelectronics and Communication Conference (OECC 2000) Technical Digest, pp. 366-367 (2000).
Ohmi, S. et al., "Rare earth mental oxides for high-K fate insulator," VLSI Design 2004, 1 Page (2004).
Ohno, H. et al., "Electrical conductivity of a sintered pellet of octalithium zirconate," 132 J. Nucl. Mat. 222-30 (1985).
Ohtsuki, T., et al., "Gain Characteristics of high concentration $Er^{3+}$-doped phosphate glass waveguide," J. Appl. Phys. 78(6):3617-3621 (1995).
Ono, H. et al., "Design of a Low-loss Y-branch Optical Waveguide," Fifth Optoelectronic and Communications Conference (OECC 2000) Technical Digest, pp. 502-503 (2000).
Padmini, P. et al. "Realization of High Tunability Barium Strontium Titanate Thin Films by rf Megnetron Sputtering," Appl. Phys. Lett. 75(20):3186-3188 (1999).
Pan, T. et al., "Planar $Er^{3+}$-doped aluminosilicate waveguide amplifier with more than 10 dB gain across C-band," Optical Society of America, 3 pages (2000).
Park et al., "Characteristics of Pt Thin Film on the Conducting Ceramics TiO and Ebonex ($Tl_4O_7$) as Electrode Materials," Thin Solid Films 258: 5-9 (1995).
Peters, D.P. et al., "Formation mechanism of silver nanocrystals made by ion irradiation of $Na^+$ —$Ag^+$ion-exchanged sodalime silicate glass," Nuclear Instruments and Methods in Physics Research B 168:237-244 (2000).
Rajarajan, M. et al., "Numerical Study of Spot-Size Expanders fro an Efficient OEIC to SMF Coupling," IEEE Photonics Technology Letters 10(8): 1082-1084 (1998).
Ramaswamy, R.V. et al., "Ion-Exchange Glass Waveguides: A Review," J. Lightwave Technology 6(6):984-1002 (1988).
Roberts, S.W. et al., "The Photoluminescence of Erbium-doped Silicon Monoxide," University of Southampton, Department of Electronics and Computer Science Research Journal, 7 pages (1996).
Saha et al., "Large Reduction of Leakage Current by Graded-Layer La Doping in (Ba0.5,Sr0.5)TiO3 Thin Films," Appl. Phys. Lett. 79(1): 111-113 (Jul. 2001).
Sanyo Vacuum Industries Co., Ltd. Products Infor, $TiO_2$, (2003), 1 page, http://www.sanyovac.co.jp/Englishweb/products?ETiO2.htm.
Sarro, P., "Silicon Carbide as a New MEMS Technology," Sensors and Actuators 82, 210-218 (2000).
Schermer, R. et al., "Investigation of Mesa Dielectric Waveguides," Proceedings of the OSA Integrated Photonics Research Topical Meeting and Exhibit, Paper No. IWB3, 3 pages (2001).
Schiller, S. et al., "PVD Coating of Plastic Webs and Sheets with High Rates on Large Areas," European Materials Research Society 1999 Spring Meeting, Jun. 1-4, 1999, Strasbourg, France, 13 pages (1999).
Scholder, V. et al., "Über Zirkonate, Hafnate und Thorate von Barium, Strontium, Lithium und Natrium," Zeitschrift für Anorganische und Allgemeine Chemie, Band 362, pp. 149-168 (1968).
Scholl, R., "Power Supplies for Pulsed Plasma Technologies: State-of-the-Art and Outlook," Advances Energy Industries, Inc. 1-8 (1999).
Scholl, R., "Power Systems for Reactive Sputtering of Insulating Films," Advances Energy Industries, Inc., 1-8 (Aug. 2001).
Second International Symposium of Polymer Surface Modification: Relevance to Adhesion, Preliminary Program, 13 pages (1999).
Seventh International Conference on $TiO_2$ Photocatalysis: Fundamentals & Applications, Toronto, Ontario, Canada, Final Program, 7 pages (Nov. 17-21, 2002).
Sewell, P. et al., "Rib Waveguide Spot-Size Transformers: Modal Properties," J Lightwave Technology 17(5):848-856 (1999).
Shaw, D.G. et al., "Use of Vapor Deposited Acrylate Coatings to Improve the Barrier Properties of Metallized Film," Society of Vacuum Coaters, 37th Annual Technical Conference Proceedings, pp. 240-244 (1994).
Shin, J.C. et al. "Dielectric and Electrical Properties of Sputter Grown $(Ba,Se)TiO_3$ Thin Films," J. Appl. Phys. 86(1):506-513 (1999).
Shmulovich, J. et al., "Recent progress in Erbium-doped waveguide amplifiers," Bell Laboratories, pp. 35-37 (1999).
Slooff, L.H. et al., "Optical properties of Erbium-doped organic polydentate cage complexes," J. Appl. Phys. 83(1):497-503 (1998).
Smith, R.E. et al., "Reduced Coupling Loss Using a Tapered-Rib Adiabatic-Following Fiber Coupler," IEEE Photonics Technology Lett. 8(8):1052-1054 (1996).
Snoeks, E. et al., "Cooperative upconversion in erbium-implanted soda-lime silicate glass optical waveguides," J. Opt. Soc. Am. B 12(8): 1468-1474 (1995).
Starner "Human-Powered Wearable Computing" 35(3&4) IBM Sys. J. 618-29 (1996)[1].
Strohhofer, C. and Polman, A. "Energy transfer to $Er^{3+}$ in Ag ion-exchanged glass," FOM Institute for Atomic and Molecular Physics, 10 pages (2001).
Sugiyama, A. et al., "Gas Permeation Through the Pinholes of Plastic Film Laminated with Aluminum Foil," Vuoto XXVIII(1-2):51-54 (1999).
Tervonen, A. "Challenges and opportunities for integrated optics in optical networks," SPIE 3620:2-11 (1999).
Ting, C.Y. et al., "Study of planarized sputter-deposited $SiO_2$," J. Vac. Sci Technol, 15(3):1105-1112 (1978).
Tomaszewski, H. et al., "Yttria-stabilized zirconia thin films grown by reactive r.f. magnetron sputtering," Thin Solid Films 287: 104-109 (1996).
Triechel, O. and Kirchhoff, V., "The influence of pulsed magnetron sputtering on topography and crystallinity of $TiO_2$ films on glass," Surface and Coating Technology 123:268-272 (2000).
Tukamoto, H. and West, A.R., "Electronic Conductivity of $LiCoO_x$ and Its Enhancement by Magnesium Doping," J. Electrochem. Soc 144(9):3164-3168 (1997).
Van Dover, R.B., "Amorphous Lanthanide-Doped $TiO_x$ Dielectric Films," Appl. Phys. Lett. 74(20):3041-3043 (1999).
Viljanen, J. and Leppihalme, M., "Planar Optical Coupling Elements for Multimode Fibers with Two-Step Ion Migration Process," Applied Physics 24(1):61-63 (1981).
Villegas, M.A. et al., "Optical spectroscopy of a soda lime glass exchanged with silver," Phys. Chem. Glasses 37(6):248-253 (1996).

\* cited by examiner

PRINTED CIRCUIT BOARD WITH INTEGRATED THIN FILM BATTERY

RELATED APPLICATIONS

The present application is related to and claims the benefit under 35 U.S.C. §119(e) of U.S. provisional patent application Ser. No. 61/238,889, filed Sep. 1, 2009, which is expressly incorporated fully herein by reference.

TECHNICAL FIELD

The field of this invention is a printed circuit board containing solid-state, thin-film secondary and primary electrochemical devices, including, for example, batteries, between and/or within its layers.

BACKGROUND

Typical electrochemical devices comprise, for example, multiple electrically active layers such as an anode, a cathode, an electrolyte, a substrate and current collectors. Some layers, such as, for example, an anode layer comprising lithium, are comprised of materials that are very environmentally sensitive. The substrate may, for example, not be a separate battery element but instead may be provided by a semiconducting surface or a conductive or insulating packaging surface of a semiconductor device or printed circuit board (PCB) to which the battery is attached. Such batteries require an encapsulation to protect the environmentally sensitive material. Some schemes encapsulate the sensitive layers of electrochemical devices, such as encapsulation with gold foil. Other schemes encapsulate the device with a pouch made of metal and plastic, for example, that seals around the perimeter of the device.

The applicants' earlier filed patents and patent applications provide certain battery and encapsulation designs and techniques, including U.S. Pat. No. 6,916,679 and US Published Patent Applications US 2006/286448 A1, US 2007/184345 A1, US 2007/202395 A1, US 2007/264564 A1, US 2008/261107 A1, US 2008/0286651, and U.S. Patent App Ser. No. 61/179,953, which are herein incorporated by reference in their entirety. These patents and applications provide, for example, types of batteries that, when incorporated with a printed circuit board, may provide a benefit.

Space on the surface of a printed circuit board (PCB), rigid or flexible, is very limited and is thus at a premium. Therefore, there is a need to incorporate electrochemical cells, such as batteries, with the design of PCBs more efficiently, to save and better utilize the PCB surface space.

SUMMARY

The various embodiments of the present invention improve upon the prior art and other various art by improving the practicality of implementing a combined electrochemical cell, such as a thin film battery, in combination with products such as a semiconductor device or a PCB. In certain exemplary embodiments of the present invention a fully encapsulated and preferably heat, pressure and moisture resilient cell may be incorporated within a PCB. The PCB and cell may be integrated to allow the cell to withstand the stressful environments in which it may be exposed during PCB fabrication. Various embodiments provide internal and/or external access to the cell via gaps, voids, pockets, spaces or other designs.

In certain exemplary embodiments of the present invention, electrochemical devices may be incorporated into PCBs or semiconductor devices in their fully encapsulated state. However, the integration of an electrochemical device into a PCB protects the electrochemical device against physically, chemically, and biologically harmful environments. Furthermore, integration of an electrochemical device into a PCB may add more functionality to the PCB and may render the PCB more valuable as a basic power-equipped electronic building block for many electronic applications.

In certain exemplary embodiments of the present invention, one can save space on the PCB surface by inserting electronic modules and components, such as electrochemical cells, including thin-film batteries, into a printed circuit board instead of, for example, on the surface of a PCB as disclosed, for example, in U.S. patent application Ser. No. 11/748,471.

One may also consider that using the PCB three-dimensionally, or in other words integrating an electrochemical device into a PCB instead of attaching the electronic device to the surface of the PCB, increases the functional electronic density per unit footprint.

Inserting electronic modules and components into the PCB may also be advantageous by, for example, limiting the total cross-sectional thickness of the functionalized or loaded PCBs. Limiting the thickness of the PCBs may be preferred, for example, for geometrical reasons, because some applications of integrated PCBs have limited volume and thickness. Limiting the thickness of the PCBs may also be preferred for mechanical reasons, for example, to reduce the momentum of a mechanical body in conjunction with vibration, centrifugal forces and acceleration, among others and instead place the given mass of that body closer to its center of gravity. For example, lengthy capacitors (that have a long height axis in comparison to their diameter because, for example, of their long terminal feet) mounted onto PCBs may be sensitive to long-term vibration that may cause the capacitors to be electrically disconnected from the PCB.

Inserting an electronic component into, rather than onto, a PCB may increase the robustness of this electronic component against external chemical, physical and biological factors. For example, the PCB surrounding an electronic component may serve as an added encapsulation or protection layer against high humidity, moisture, water, oxygen, corrosion by acids and bases, solvents, UV radiation, temporary extreme (high or low) temperatures, scratching objects, mechanical shock and micro-organism attack.

Additionally, providing an electrochemical cell or thin-film battery to connect to an electronic circuit already inserted into a PCB may simplify the production of this type of electronic component and prevent human error in attaching or soldering electronic components to PCBs. Therefore, a PCB with integrated electrochemical cell or thin-film battery may be used as a basic, power source equipped building block for electronic circuitry that simplifies and compacts consumer and mini/micro-electronics.

The goal of certain exemplary embodiments of the present invention, for example, is to avoid limiting the lateral extension of the electrochemical cell embedded in a PCB to only a sub-region of the PCB surface. Instead the cell may, for example, extend beyond the edges of the PCB as shown in the drawings. This extension may, for example, provide easy access to a contact or contact region of the cell.

Another goal of certain exemplary embodiments of the present invention is to embed a cell into a PCB with, for example, at least one electrically conducting layer above or below the cell, as opposed to using a PCB with all electrically insulating layers, as shown in certain exemplary figures. An embodiment, for example, that includes a battery with a metal substrate terminal and metal encapsulation terminal may be preferred over a design that includes insulating layers above and below an energy cell, such as a thin film battery.

Another goal of certain exemplary embodiments of the present invention is to avoid the need to fill in any potential gaps around the embedded cell and instead, for example, allow void space in that region. This void may, for example, allow access or contact with the cell or certain portions of the cell.

Yet another goal of certain exemplary embodiments of the present invention is to avoid requiring a printed circuit board structure using multiple electrically insulating layers to embed the cell. Instead, for example, the cell may be embedded in a single-layer printed circuit board. This embodiment may be preferred because, for example, it may be simplified and thinner than other embodiments.

There are many benefits to, for example inserting a cell or thin-film battery into a PCB. First, there are architectural benefits that protect the cell against certain chemical, physical and biological impact factors. Second, such a technique may be more cost-effective than providing the PCB and the electrochemical cell or thin-film battery as separate items wherein a customer in the product fabrication or integration chain would be able to attach the electrochemical cell or thin-film battery only at the surface of the PCB.

An exemplary embodiment of the present invention includes a printed circuit board comprising a layer stack having two electrically insulating layers comprising conductor traces, wherein each of said electrically insulating layers having a perimeter and an electrochemical cell inserted between said layers wherein a portion of said electrochemical cell extends laterally beyond the perimeter of one of said insulating layers.

Another exemplary embodiment of the present invention includes a printed circuit board comprising a layer stack having two electrically insulating layers including conductor traces and an electrically conducting layer and an electrochemical cell inserted in said layer stack wherein said electrochemical cell is embedded between said electrically conducting layer and electrically insulating layers of said layer stack.

Another exemplary embodiment of the present invention includes a printed circuit board comprising a layer stack having a plurality of, for example two, electrically insulating layers including conductor traces, a plurality of, for example two, electrically conducting layers and an electrochemical cell inserted in said layer stack wherein said electrochemical cell is embedded between said electrically conducting layers.

Another exemplary embodiment of the present invention includes a printed circuit board comprising a layer stack having a plurality of, for example two, electrically insulating layers including conductor traces, an electrochemical cell inserted in said layer stack and a gap located at an edge of said electrochemical cell.

Another exemplary embodiment of the present invention includes a printed circuit board comprising one electrically insulating layer including conductor traces and an electrochemical cell located within the interior of said electrically insulating layer.

Another exemplary embodiment of the present invention includes a battery fabricated between the layers of, for example, a PCB. The battery may, for example, include a first electrical contact, a bonding layer coupled with the first electrical contact and a first embedded conductor, at least one battery cell structure in selective electrical contact with the first electrical contact via the first embedded conductor, which may be formed or disposed within a PCB.

The bonding layer coupled with the PCB may have more than one conductor, such as an optional, second embedded conductor, which in turn creates an optional, selective electrical contact of the PCB with said first electrical contact. The bonding layer and the at least one battery cell structure may be sandwiched within a PCB.

The first electrical contact may include, for example, an encapsulate metal. The bonding layer may be an adhesive material, an insulating material, a plastic, a polymeric material, glass and/or fiberglass. An insulating reinforcement layer may be embedded within the bonding layer. Such a reinforcement layer may be selectively conductive. The conductor may be, for example, a tab, a wire, a metal strip, a metal ribbon, multiple wires, multiple metal strips, multiple metal ribbons, a wire mesh, perforated metal, a metal coating applied to the adhesive layer or a disk. The conductor may be woven within the bonding layer and the bonding layer may include a slit within which the embedded conductor is woven.

The battery cell structure may include an anode, an electrolyte, a cathode and a barrier layer. The cathode may, for example, not be annealed at all, annealed at lower temperatures or annealed at higher temperatures by using convection furnaces, rapid thermal anneal methods or by a laser annealing and/or crystallization process.

Another exemplary embodiment of the present invention includes a method of manufacturing a thin film battery comprising, in no particular order, the steps of creating a selectively conductive bonding layer, coupling the bonding layer with a first contact layer, coupling a first side of a battery cell structure within a pocket formed in, for example, a PCB, and coupling the battery cell structure with the PCB. Optionally, the bonding layer may be made selectively conductive at an additional location at which the selectively conductive bonding layer creates an electrical contact between the first contact layer and the PCB. Yet another exemplary embodiment of the present invention includes a method of manufacturing a thin film battery comprising, in no particular order, the steps of creating a selectively conductive bonding layer, coupling the bonding layer with a first contact layer, coupling a first side of a battery cell with the first contact layer as well, coupling the bonding layer with an interior surface within a PCB, and coupling a second side of the battery cell structure with the bonding layer.

Examples of this exemplary embodiment may include creating a battery cell structure with anode, cathode and electrolyte layers, embedding at least one conductor within the bonding layer, weaving at least one conductive wire through the bonding layer wherein selective portions of the conductive wire are exposed, heating the bonding layer and compressing the conductor within the bonding layer, and insulating the battery with an insulating material. This exemplary embodiment may include providing an insulating reinforcement layer embedded within the bonding layer. The reinforcement layer may be selectively conductive.

Yet another exemplary embodiment of the present invention includes a battery within, for example, a PCB wherein the first side of the battery cell structure is at least in direct mechanical contact with an interior surface of the PCB. This exemplary embodiment includes a first electrical contact, a bonding layer coupled with a first electrical contact and a first embedded conductor, at least one battery cell structure in selective electrical contact with the first electrical contact via the first embedded conductor, the bonding layer coupled with the first electrical contact and comprising a second embedded conductor that is in selective electrical contact with the first electrical contact and the printed circuit board. The bonding layer and the at least one battery cell structure are sandwiched between the first contact layer and within a PCB.

Another exemplary embodiment of the present invention includes a battery within, for example, a PCB wherein the battery cell structure is mechanically separated by at least the bonding layer (and not in direct mechanical contact with the interior PCB surfaces). The exemplary embodiment includes a first electrical contact, a bonding layer coupled with the first electrical contact and a first embedded conductor, at least one battery cell structure in selective electrical contact with the first electrical contact via said first embedded conductor, the bonding layer coupled with the PCB and having an optional, second embedded conductor in the bonding layer, which in turn creates an optional, selective electrical contact of the PCB with the first electrical contact. The bonding layer and the at least one battery cell structure are sandwiched between the first contact layer and an interior surface of a PCB.

In another exemplary embodiment of the present invention, a method of manufacturing a thin film battery includes creating a selectively conductive bonding layer, coupling the bonding layer with a first contact layer, coupling a first side of a battery cell structure with an interior surface of a layer of, for example, a PCB and coupling a second side of the battery cell structure with the bonding layer.

In yet another exemplary embodiment of the present invention, a method of manufacturing a thin film battery includes creating a selectively conductive bonding layer, coupling the bonding layer with a first contact layer, coupling a first side of a battery cell structure with the first contact layer, coupling a second side of the battery cell structure with the selectively conductive bonding layer and coupling the bonding layer within the layers of, for example, a PCB.

Another exemplary embodiment of the present invention includes an electrical connection between the battery cell and the PCB. The electrical connection between the battery cell and the interior surfaces of layers within, for example, a PCB can be made by direct physical contact or by wire bonding.

In another exemplary embodiment of the present invention, prior to its integration within the PCB or conductive or insulating surface within a PCB, the battery may be fabricated as a discrete device and then integrated as a whole together with its substrate and its encapsulation inside of the semiconducting device.

Another embodiment of the present invention includes the electrical connection between a multi-battery cell stack within the PCB through the interior of the PCB to the surface of the PCB.

DETAILED DESCRIPTION

The present invention is not limited to the particular methodology, compounds, materials, manufacturing techniques, uses, and applications described herein, as these may vary. The terminology used herein is used for the purpose of describing particular embodiments only, and is not intended to limit the scope of the present invention. The singular forms "a," "an," and "the" include the plural reference unless the context clearly dictates otherwise. Thus, for example, a reference to "an element" is a reference to one or more elements and includes equivalents thereof known to those skilled in the art. Similarly, for another example, a reference to "a step" or "a means" is a reference to one or more steps or means and may include sub-steps and subservient means. All conjunctions used are to be understood in the most inclusive sense possible. Thus, the word "or" should be understood as having the definition of a logical "or" rather than that of a logical "exclusive or" unless the context clearly necessitates otherwise. Structures described are to be understood also to refer to functional equivalents of such structures. Language that may be construed to express approximation should be so understood unless the context clearly dictates otherwise.

Unless defined otherwise, all technical and scientific terms used herein have the same meanings as commonly understood by one of ordinary skill in the art to which this invention belongs. Preferred methods, techniques, devices, and materials are described, although any methods, techniques, devices, or materials similar or equivalent to those described herein may be used in the practice or testing of the present invention. Structures described herein are to be understood also to refer to functional equivalents of such structures.

All patents and other publications identified are incorporated herein by reference for the purpose of describing and disclosing, for example, the methodologies described in such publications that might be used in connection with the present invention. These publications are provided solely for their disclosure prior to the filing date of the present application. Nothing in this regard should be construed as an admission that the inventors are not entitled to antedate such disclosure by virtue of prior invention or for any other reason.

Figure 1A:
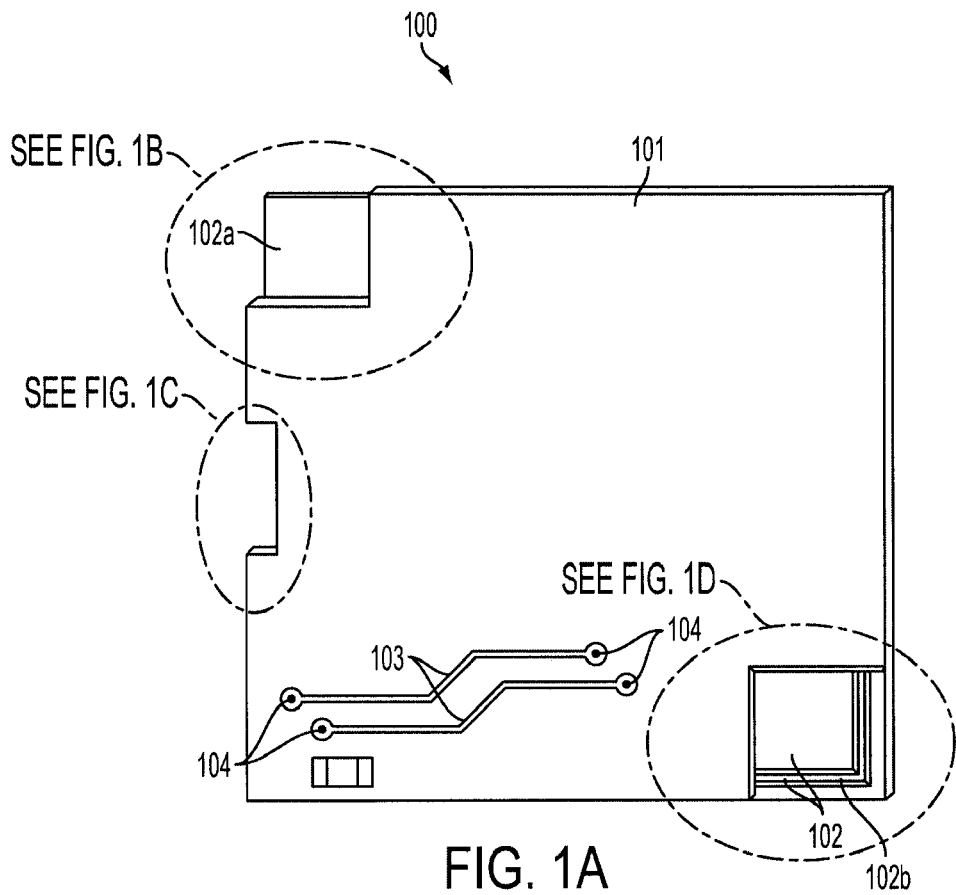
FIG. 1A shows a top down view of an exemplary embodiment of the present invention including an electrochemical cell that is embedded in a PCB with an edge of the cell extending beyond the edge of the PCB.
Figure 1B:
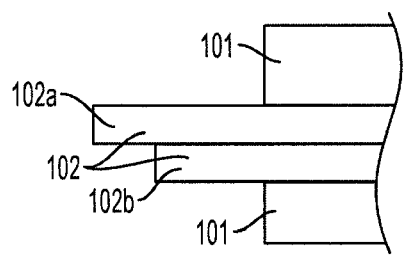
FIG. 1B shows an expanded side cross-sectional view of a portion of an exemplary embodiment of the present invention including an electrochemical cell that is embedded in a PCB with an edge of the cell extending beyond the edge of a PCB.
Figure 1C:
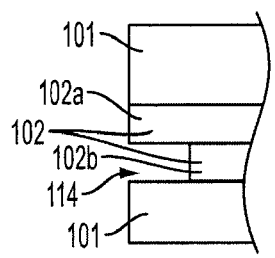
FIG. 1C shows an expanded side cross-sectional view of a portion of an exemplary embodiment of the present invention including an electrochemical cell that is embedded in a PCB with a portion of the PCB removed to form a gap or space.
Figure 1D:
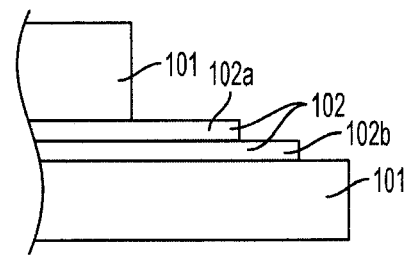
FIG. 1D shows an expanded side cross-sectional view of a portion of an exemplary embodiment of the present invention including an electrochemical cell that is embedded in a PCB with a portion of the PCB removed to expose a portion of the cell.

FIGS. 1A, 1B, 1C and 1D show various alternative exemplary embodiments of the present invention, device 100. FIG. 1A shows a top down view of exemplary device 100 including an electrochemical cell 102 embedded in printed circuit board (PCB) 101 with an edge of cell 102 extending beyond the edge of PCB 101. PCB 101 or other exemplary embodiments of the present invention may include a stack of multiple, for example two, three, four, five, six, seven, eight or more, layers. For example, as shown in FIG. 1A, PCB 101 includes two layers. Electrochemical cell 102 may also have multiple layers. For example, as shown in FIG. 1A, electrochemical cell 102 includes two layers, top layer 102a and bottom layer 102b. Top layer 102a may be, for example, the positive terminal of electrochemical cell 102 and bottom layer 102b may be, for example, the negative terminal of electrochemical cell 102. In another exemplary embodiment of the present invention, top layer 102a may be, for example, the negative terminal of electrochemical cell 102 and bottom layer 102b may be, for example, the positive terminal of electrochemical cell 102. FIG. 1B shows an expanded side view of device 100 including cell 102 extending beyond the edge of PCB 101. PCB 101 may be constructed, at least in part, from flame retardant 4 (FR4) or other PCB layer materials known in the art, such as, for example, polytetrafluoroethylene, FR-1, CEM-1 (cotton paper and epoxy), CEM-2 (cotton paper and epoxy), CEM-3 (woven glass and epoxy), CEM-4 (woven glass and epoxy), CEM-5 (woven glass and polyester), FR-2 (phenolic cotton paper), FR-3 (cotton paper and epoxy), FR-5 (woven glass and epoxy), FR-6 (matte glass and polyester), G-10 (woven glass and epoxy) and/or polyimide such as, for example, Kapton®. PCB 101 may include conducting traces 103 on one or both outer surfaces of the PCB. Conducting traces 103 may be constructed of, for example, Cu foil. Conducting traces 103 may be included on a surface mount, such as a single surface mount, as shown in FIG. 1A. FIG. 1C shows another exemplary expanded side view of device 100 including a portion of PCB 101 removed to form a gap 114 in PCB 101. FIG. 1D shows an expanded view of device 100 including PCB 101 with a portion removed to expose a portion of cell 102. FIGS. 1B, 1C and 1D also show electrochemical cell 102 with multiple, for example two, layers. However, exemplary embodiments of the present invention may also include an electrochemical cell with more than two, for example three, four, five, six, seven, eight or more, layers. Furthermore, exemplary embodiments shown in FIGS. 1A, 1B, 1C and 1D may also include multiple, for example two, three, four, five, six, seven, eight or more, electrochemical cells.

Figure 2:
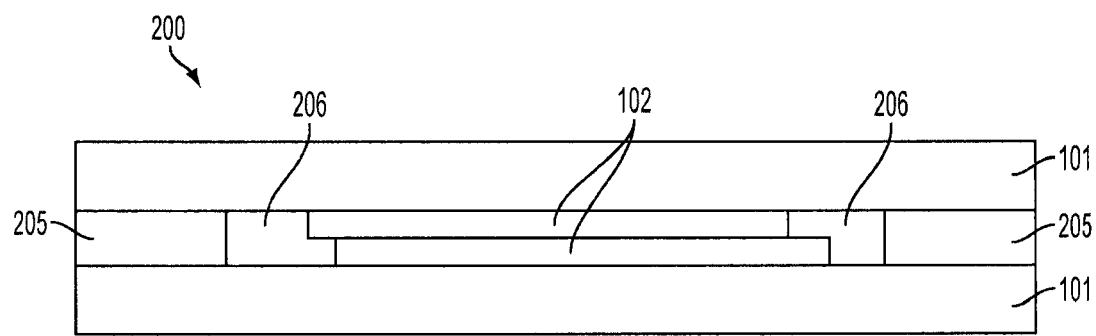
FIG. 2 depicts a side cross-sectional view of an embodiment of the present invention including a three layer PCB including an electrochemical cell with a pocket on both sides of the embedded electrochemical cell.

FIG. 2 shows device 200, a side cross-sectional view of an exemplary embodiment of the present invention, including a three-layer PCB 101 with pockets 206. Pockets 206 have gaps of space on the sides of electrochemical cell 102 that may be embedded in insulating FR4 layers. Pockets 206 may be on one or more sides of embedded electrochemical cell 102. PCB 101 may include traces and/or components on one or both outer sides of PCB 101. Spacers 205 make up a portion of PCB 101 and connect the top layer of PCB 101 to the bottom layer of PCB 101. Spacers 205 may further define and/or provide support and stability to device 200. Pockets 206 may, for example, reduce stresses within the assembly, provide a buffer region, provide a place for other components or design features and/or provide capacity for thermal controls.

Figure 3:
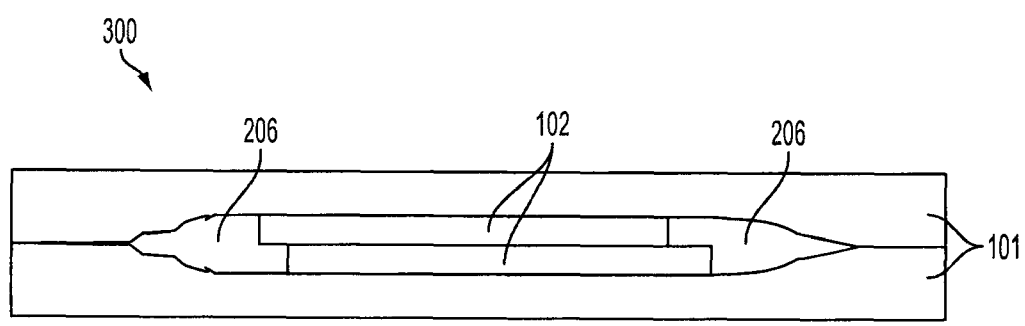
FIG. 3 depicts a side cross-sectional view of an exemplary embodiment of the present invention including a multi-layer PCB including an embedded electrochemical cell with a pocket on both sides of the embedded electrochemical cell.

FIG. 3 shows an exemplary embodiment of the present invention including alternate PCB 101 and pocket 206 structures. PCB 101 may include two layers, which are wrapped around electrochemical cell 102. Therefore, the inside of the two layers of PCB 101 have a curved structure, causing pockets 206 to include a similarly curved exterior shape. Furthermore, as shown in FIG. 3, electrochemical cell 102 may be thinner than a layer of PCB 101 or thinner than the combination of multiple layers of PCB 101. However, according to alternate exemplary embodiments of the present invention, electrochemical cell 102 may be thicker than a layer of PCB 101, thicker than the combination of multiple, for example two, three, four, five, six, seven, eight or more, layers of PCB 101 or about the same thickness as one or multiple layers of PCB 101.

Figure 4:
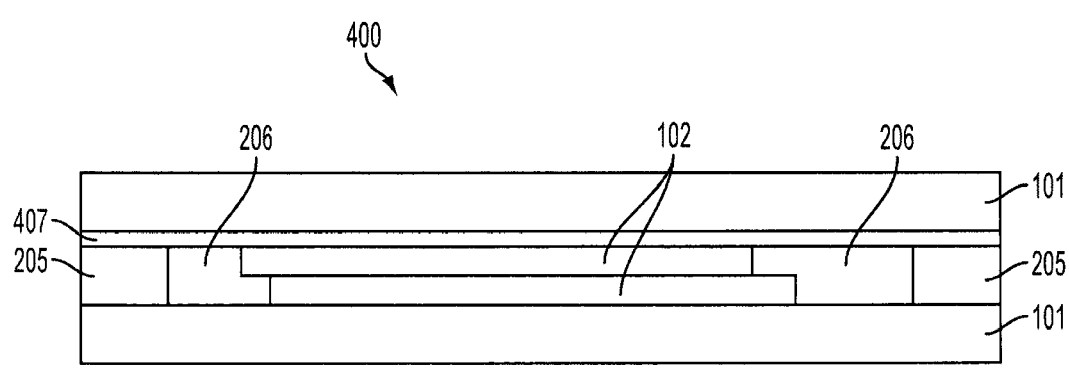
FIG. 4 shows a side cross-sectional view of an exemplary embodiment of the present invention including a conducting layer between the electrochemical cell and either the top of bottom insulating layer of the PCB.

FIG. 4 shows device 400, an exemplary embodiment of the present invention that includes, for example, a conductive surface with a conductive contact pad, a conductive line, a conductive via or another conductive layer. A conductive surface also may be formed together with an insulating surface, such as a PCB, where the conductive surface may be formed on an inner layer of the PCB. FIG. 4 shows, for example, embedded conductor 407 embedded within or on an interior insulating FR4 layer. Embedded conductor 407 may be externally accessible at the edge of PCB 101. Embedded conductor 407 may not extend all the way to the edge of PCB 101 and therefore function, for example, as a PCB internal electrical interconnect. Embedded conductor 407 may function, for example, as a selectively conductive bonding layer. A selectively conductive bonding layer may, for example, permit conduction from cell 102 through the bonding layer to a cell contact or to one or more traces at specific points (not shown). A selectively conductive bonding layer may also provide insulation between a cell contact and PCB 101. Other types of battery cell structures may also be used. Electrochemical cell 102 may take several forms. For example, cells may not be completely packaged, and may be similar to cells described in FIG. 1 and/or FIG. 3 of U.S. Patent Publication No. 2007/264564 (incorporated herein, in its entirety, by reference), or cells that are fully packaged, and may be similar, for example, to the cell described in FIG. 20 of U.S. Patent Publication No. 2008/261107 (incorporated herein, in its entirety, by reference).

Figure 5A:
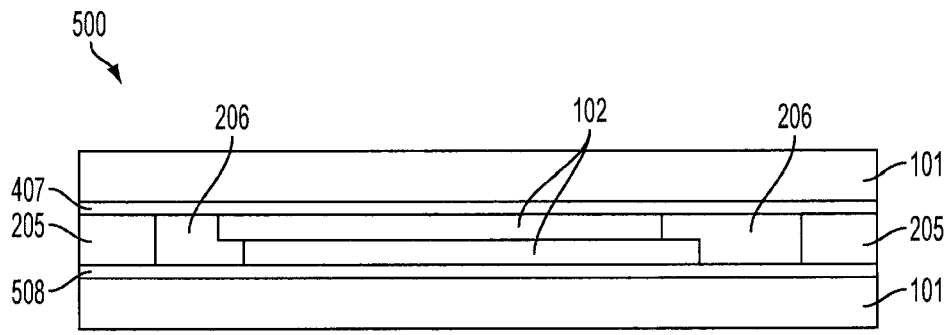
FIG. 5A shows a side cross-sectional view of an exemplary embodiment of the present invention including an electrochemical cell with electrically conducting layers on the top and the bottom of the cell and in contact with the insulating layers of the PCB.
Figure 5B:
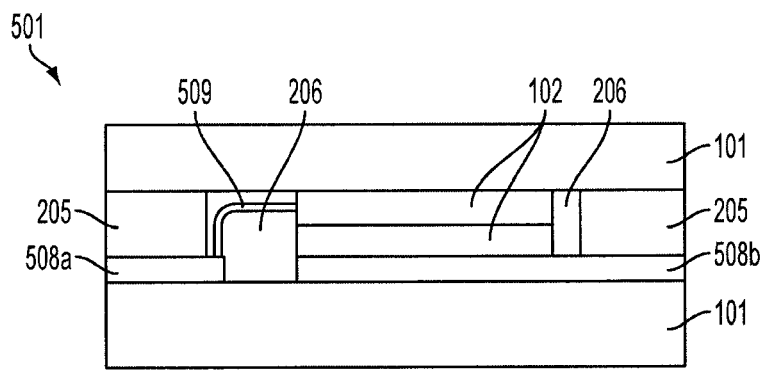
FIG. 5B shows a side cross-sectional view of an exemplary embodiment of the present invention including an electrochemical cell with an electrically conducting layer split into two portions, one portion on the bottom of the cell and the second portion electrically connected to the electrochemical cell by wire bonding.
Figure 5C:
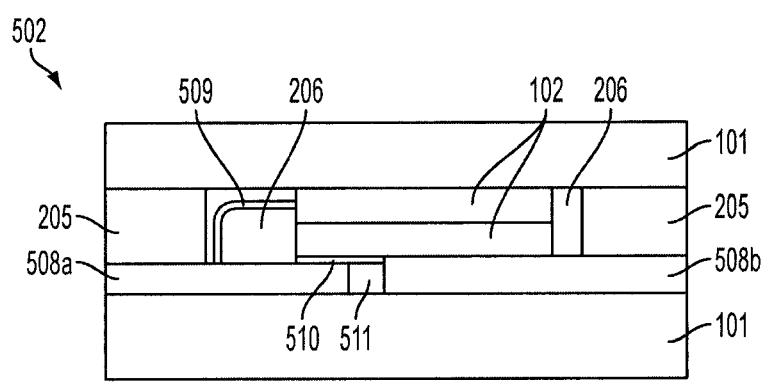
FIG. 5C shows a side cross-sectional view of an exemplary embodiment of the present invention including an electrochemical cell with an electrically conducting layer split into two portions on the bottom of the cell, one portion in contact with the cell and the second portion physically insulated from the cell but electrically connected to the electrochemical cell by wire bonding.

FIGS. 5A, 5B and 5C show various alternative exemplary embodiments of the present invention, device 500. FIG. 5A shows an example embodiment of the present invention that includes an electrochemical cell 102 with a second embedded conductor 508 that selectively creates an electrical contact between a first or second contact (not shown) and PCB 101. The conductive or insulating surface of PCB 101 may be selectively insulating between the contact points at which first embedded conductor 407 and second embedded conductor 508 meet PCB 101. Embedded conductors 407 and 508 may be externally accessible at the edges of PCB 101. Alternatively, embedded conductors 407 and 508 may not extend to the edges of PCB 101 and instead serve as PCB internal electrical interconnects. Exemplary embodiments of the present invention may also include more than two, for example three, four, five, six, seven, eight or more, embedded conductors.

FIGS. 5B and 5C show example embodiments of the present invention that include embedded conductor 508 and a second conductor in the form of micro wire bonding 509. FIG. 508B shows embedded conductor 508 split into two portions, conductor portions 508a and 508b. Conductor portion 508b is coupled with and electrically connected to electrochemical cell 102 and conductor portion 508a may be physically separated from electrochemical cell 102. Conductor portion 508a is selectively electrically connected to electrochemical cell 102 via wire bonding 509. However, conductor portion 508a may be electrically connected to electrochemical cell 102 via other methods, such as, for example, various other various metal conductors. FIG. 5C shows embedded conductor 508 split into portions 508a and 508b and conductor portion 508a extends, unlike in FIG. 5B, below electrochemical cell 102. Conductor portion 508a is physically separated from electrochemical cell 102 by insulator 510.

According to certain embodiments of the present invention, first embedded conductor 407 and second embedded conductor 508 may be, for example, placed within bonding layers in many different ways. For example, embedded conductors may consist of different materials such as a metal tab, a metal wire, a metal strip, a metal ribbon, multiple metal wires, multiple metal strips, multiple metal ribbons, a metal wire mesh, perforated metal foil, perforated metal, a metal coating applied to the adhesive layer, a metallic disk, a metallically coated fiberglass or combinations thereof may be used. First embedded conductor 407 and second embedded conductor 508 may provide electrical conduction between cell 102 and a cell contact. A bonding layer may provide insulation between the electrical contact and PCB 101. Embedded conductors 407 and 508 may be woven or placed within the bonding layer through slits, holes or other means. Embedded conductors 407 and 508 may be, for example, disks embedded within the bonding layer.

In another exemplary embodiment of the present invention, a reinforcement layer may be placed within the bonding layer. For example, a fiberglass material may cover half of one surface of the bonding layer, may be woven through the bonding layer and/or may cover the other half of the bonding layer. Such a layer of fiberglass without a conductive coating would insulate the electrochemical device and other materials. The fiberglass may be coated in a localized area with a conductive material. Such conductive coatings can coat the fiberglass area on the top and bottom surface of the bonding layer. The fiberglass may conduct between the upper contact and the cell. Conductive material may be disposed on the fiberglass using ink jet, silk screen, plasma deposition, e-beam deposition, spray and/or brush methods. The reinforcement layer may include materials other than fiberglass, such as, for example, Kevlar®, plastic or glass.

In another exemplary embodiment of the present invention, the electrical contact may have selective contact with the battery cell structure through holes in the bonding layer. The bonding layer and the battery cell structure may be, for example, pressed together to create a contact. Alternatively, the layers may make contact with one another by applying, for example, conductive glues or inks, solder, welding, wirebond, anisotropic conductive film or lithium in or near the hole in the bonding layer.

Embedded conductors 407 and 508 and/or the electrical contact may consist of, for example, gold, platinum, stainless steel, titanium, vanadium, chromium, manganese, iron, cobalt, nickel, copper zirconium, niobium, molybdenum, hafnium, tantalum, tungsten, aluminum, indium, tin, silver, carbon, bronze, brass, beryllium, or oxides, nitrides, carbides, and alloys thereof. The electrical contact may consist of a metal foil, stainless steel or any other metallic substance that has a requisite amount of conductivity. The metal foil may comprise a solderable alloy such as copper, nickel or tin. The electrical contact may be, for example, less than 100 microns thick, less than 50 microns thick or less than 25 microns thick.

Electrochemical cell 102 shown in exemplary embodiments of the present invention may include a cathode, an anode and an electrolyte. For example, the cathode may comprise $LiCoO_2$, the anode may comprise Lithium and the electrolyte may comprise LIPON. Other electrochemical devices may be used as needed.

Electrochemical cell 102 may be coupled with the interior layers or surfaces of PCB 101 in a number of ways. In an exemplary embodiment of the present invention, electrochemical cell 102, for example, may be coupled with the interior layers of PCB 101 using, for example, glue, solder, welding, wirebond or anisotropic conductive film. Glue may be any material that may adhere electrochemical cell 102 to PCB 101, such as cement glue or resin glue. Glue may create a mechanical and/or a chemical bond between electrochemical cell 102 to PCB 101. Glue may also include chemically bonding electrochemical cell 102 to PCB 101 without introducing another material or layer. Glue may be electrically conducting, semi-conducting or insulating.

In certain exemplary embodiments of the present invention, the interior layers of a PCB, including the conductive or insulating interior layer surface of PCB 101, act as a substrate for the electrochemical cell. Electrochemical cell 102 may be deposited or otherwise positioned on the layer surface of PCB 101. Electrochemical cell 102 may also be coupled to the interior layer surface of PCB 101 using, for example, glue, solder, welding, wirebond or anisotropic conductive film.

In an exemplary embodiment of the present invention, a $LiCoO_2$ cathode layer may be deposited on the interior layer of, for example, PCB 101. Deposition techniques known in the art include, but are not limited to, reactive or non-reactive RF magnetron sputtering, reactive or non-reactive pulsed DC magnetron sputtering, reactive or non-reactive DC diode sputtering, reactive or non-reactive thermal (resistive) evaporation, reactive or non-reactive electron beam evaporation, ion-beam assisted deposition, plasma enhanced chemical vapor deposition, spin coating, ink-jetting, thermal spray deposition and dip coating. As part of the fabrication process, for example, the cathode may be annealed using a thermal anneal at low temperatures (e.g. <400° C.), thermal anneal at high temperatures (e.g. >400° C.), rapid thermal anneal or by using convection furnaces. Another or an alternative post-deposition anneal may include laser annealing to improve the crystallization of the $LiCoO_2$ layer to fine-tune and optimize its chemical properties, such as its electrochemical potential, energy, power performance and reversible lattice parameters on electrochemical and thermal cycling.

Following deposition of the cathode layer, an electrolyte may be deposited on the cathode, followed by an anode, using any of many processes known to someone of ordinary skill in the art. A metal encapsulate layer may be formed on the electrochemical cell itself instead of using embedded conductor 407 and/or embedded conductor 508 as shown, for example, in FIG. 5. The metal encapsulate layer may be made of a metal foil, stainless steel or any other metallic substance with a requisite amount of conductivity. The metal foil may comprise a solderable alloy such as, for example, alloys of copper, nickel or tin.

Figure 6A:
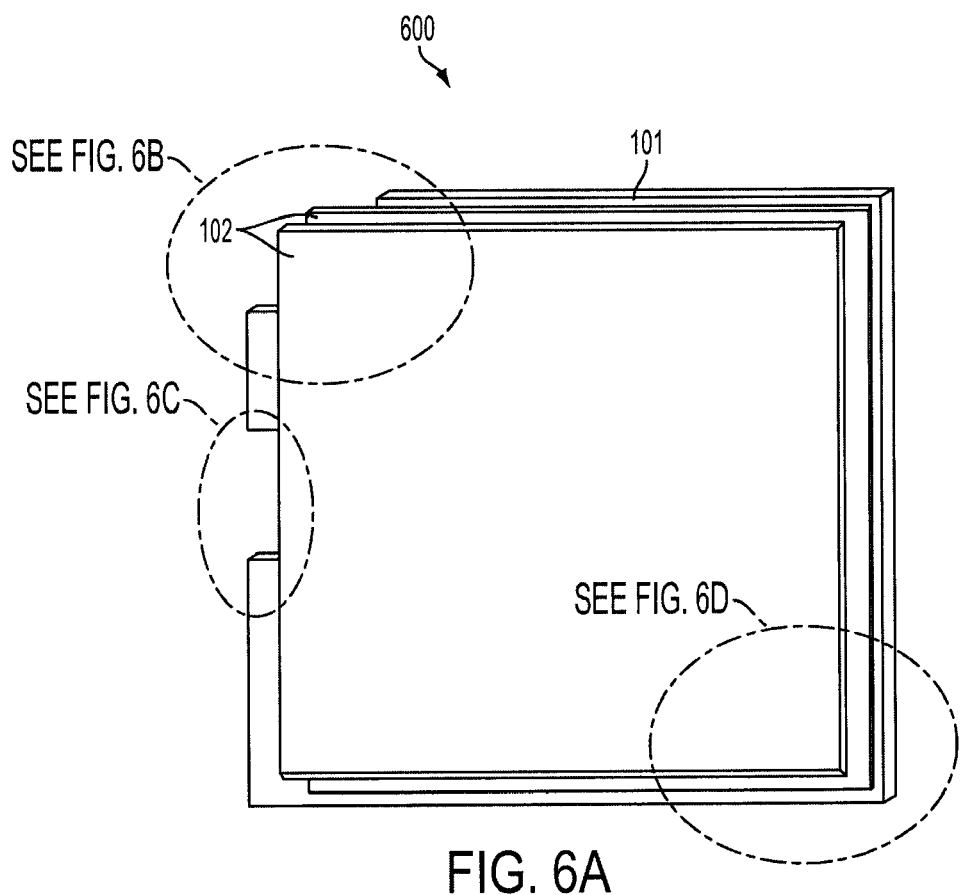
FIG. 6A shows a top down view of an exemplary embodiment of the present invention including a PCB and an embedded electrochemical cell.
Figure 6B:
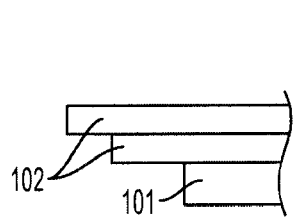
FIG. 6B shows an expanded side cross-sectional view of a portion of an exemplary embodiment of the present invention including a PCB with an embedded electrochemical cell that extends beyond an edge of the PCB.
Figure 6C:
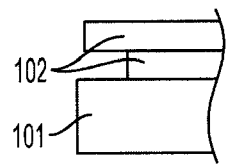
FIG. 6C shows an expanded side cross-sectional view of a portion of an exemplary embodiment of the present invention including a PCB with an embedded electrochemical cell that is flush with an edge of the PCB.
Figure 6D:
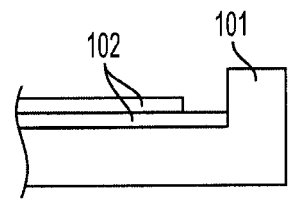
FIG. 6D depicts a side expanded cross-sectional view of a portion of an exemplary embodiment of the present invention including a PCB and an embedded electrochemical cell with a portion of the PCB removed to expose a portion of the cell.
Figure 7A:
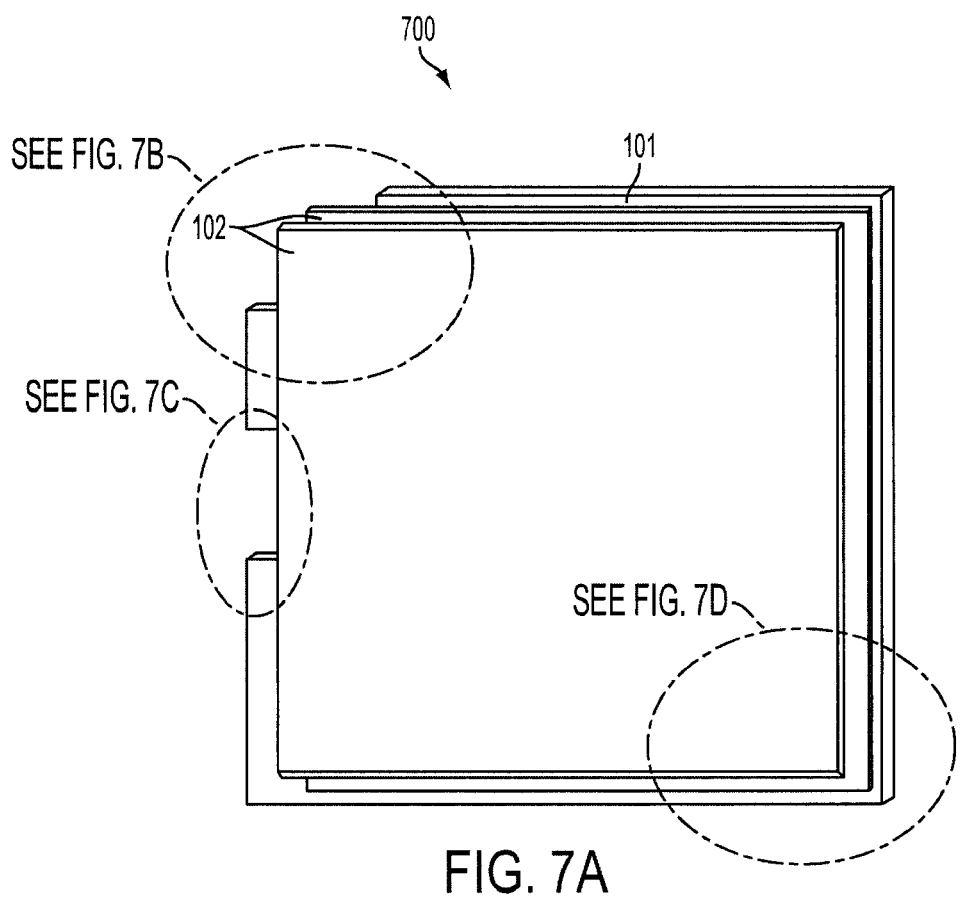
FIG. 7A shows a top down view of an exemplary embodiment of the present invention including a PCB and an embedded electrochemical cell and a conducting layer between the electrochemical cell and the PCB.
Figure 7B:
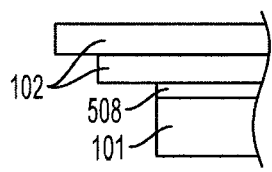
FIG. 7B shows an expanded side cross-sectional view of a portion of an exemplary embodiment of the present invention including a PCB and an embedded electrochemical cell and a conductor on the PCB with an edge of the cell extending beyond the edge of a PCB.
Figure 7C:
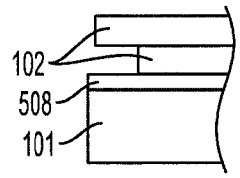
FIG. 7C shows an expanded side cross-sectional view of a portion of an exemplary embodiment of the present invention including a PCB and an embedded electrochemical cell and a conducting layer between the electrochemical cell and the PCB with a portion of the PCB removed to form a gap or space.
Figure 7D:
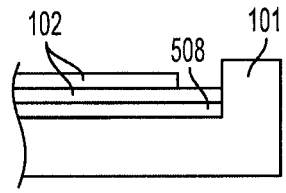
FIG. 7D depicts a side expanded cross-sectional view of a portion of an exemplary embodiment of the present invention including a PCB and an embedded electrochemical cell and a conducting layer between the electrochemical cell and the PCB with a portion of the PCB removed to expose a portion of the cell.

FIGS. 6A, 6B, 6C and 6D show various alternative exemplary embodiments of the present invention, device 600. Device 600 includes an example embodiment of the present invention that includes electrochemical cell 102 embedded on PCB 101. FIG. 6B, for example, shows electrochemical cell 102 extending beyond an edge of PCB 101. FIG. 6C shows the top layer of electrochemical cell 102 flush with an edges of PCB 101. Furthermore, unlike, for example, device 100, an embodiment may not include a PCB layer over an electrochemical cell, for example, a micro-energy cell (MEC). Certain exemplary embodiments may include an open PCB or extended openings in a layer of the PCB. FIG. 6D, for example, shows a space in the PCB so that a portion or the entire surface of the PCB is exposed.

FIGS. 7A-7D show various alternative exemplary embodiments of the present invention, device 700. Device 700 includes conductor 508 on PCB layer 101 with an embedded MEC. PCB 101 may include traces and components on one or both of its sides. These exemplary embodiments may also include, for example, open PCB structures as shown in FIGS. 6A-6D.

Figure 8A:
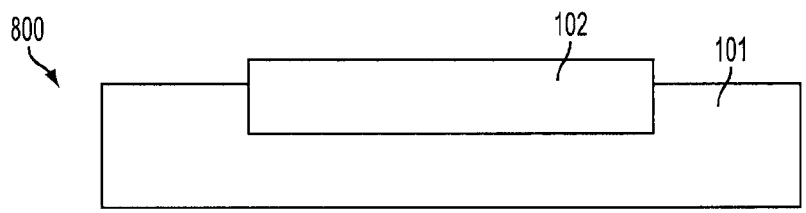
FIG. 8A provides a cross-sectional view of an exemplary embodiment of the present invention including a PCB and an electrochemical cell and a portion of the cell is embedded within the PCB and a portion of the cell is externally accessible.
Figure 8B:
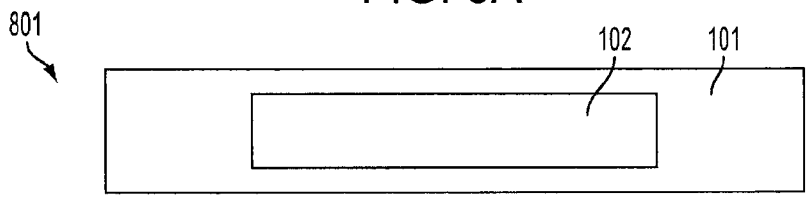
FIG. 8B provides a cross-sectional view of an exemplary embodiment of the present invention including an electrochemical cell wholly embedded within a PCB.
Figure 8C:
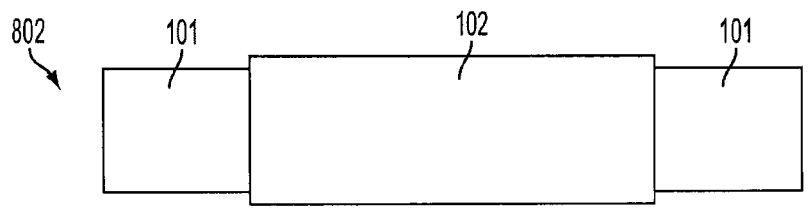
FIG. 8C provides a cross-sectional view of an exemplary embodiment of the present invention including a PCB with an electrochemical cell externally accessible from more than one side of the PCB.
Figure 8D:
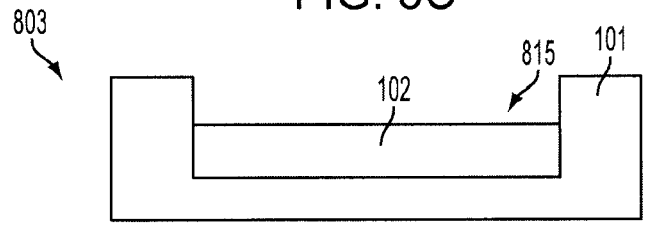
FIGS. 8D, 8E, 8F, 8G, 8H, 8I, 8J and 8K provide exemplary embodiments of the present invention with an electrochemical cell embedded in a PCB.
Figure 8E:
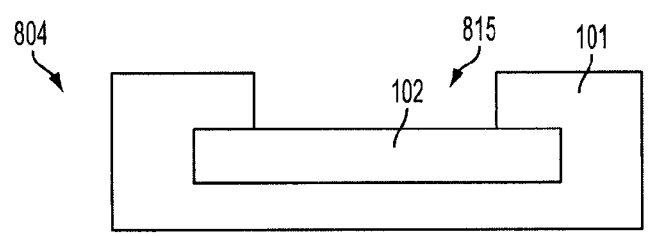
Figure 8F:
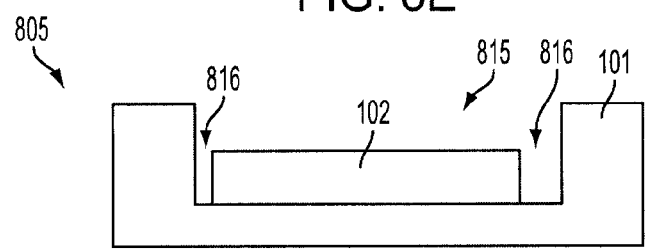
Figure 8G:
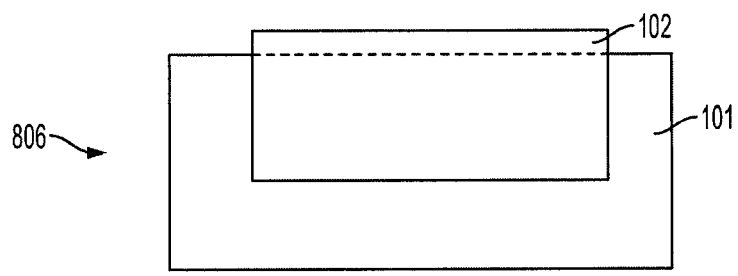
Figure 8H:
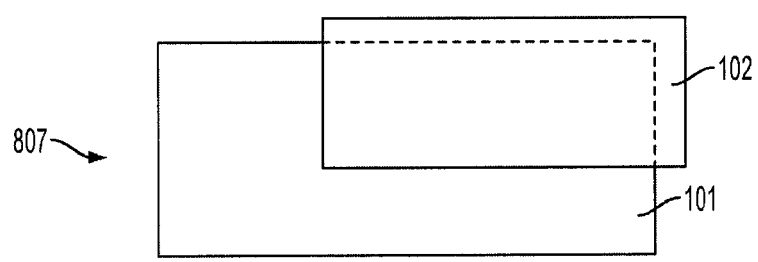
Figure 8I:
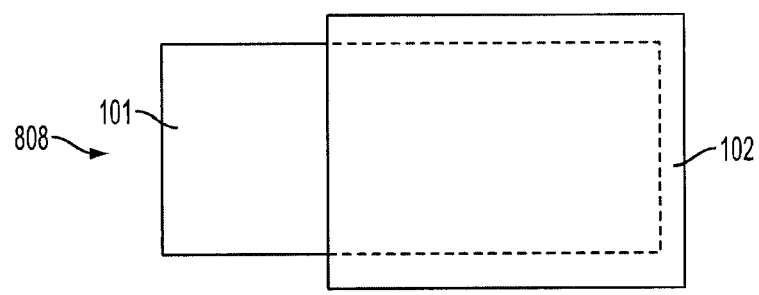
Figure 8J:
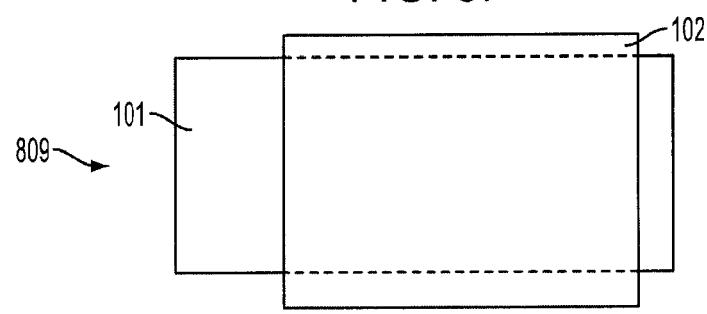
Figure 8K:
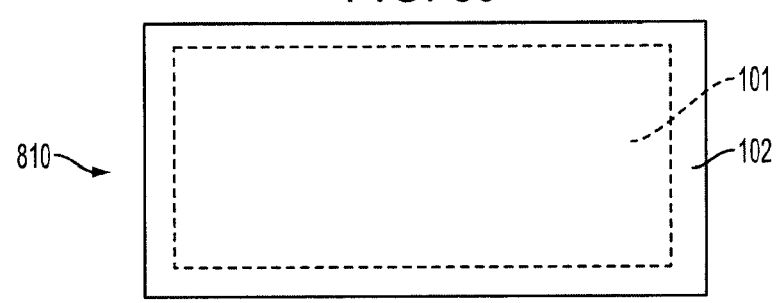

FIGS. 8A-8K show various alternative exemplary embodiments of the present invention, device 800. FIG. 8A is a cross-sectional view and shows electrochemical cell 102 placed so that a portion of cell 102 is embedded within PCB 101 and a portion of cell 102 is externally accessible. FIG. 8B is a cross-sectional view and shows electrochemical cell 102 wholly embedded within PCB 101. FIG. 8C is a cross-sectional view and shows electrochemical cell 102 externally accessible from more than one side of PCB 101. Electrochemical cell 102 may, for example, extend from the PCB on three or four sides. FIG. 8D is a cross-sectional view and shows PCB 101 with an open structure such that electrochemical cell 102 may be externally accessible from the top of PCB 101 through PCB opening 815. FIG. 8E is a cross-sectional view and shows that opening 815 of PCB 101 may be less wide than the width of electrochemical cell 102. PCB 101 extends over portions of the ends of cell 102 such that cell 102 is partially embedded within the ends of PCB 101. FIG. 8F is a cross-sectional view and shows that opening 815 of PCB 101 may be wider than the width of electrochemical cell 102. Electrochemical cell 102 may be placed within opening 815 in PCB 101 such that the ends of cell 102 do not contact PCB 101, creating gaps 816 between cell 102 and PCB 101. Electrochemical cell 102 and PCB 101 may be connected in various alternative configurations, examples of which are shown in FIGS. 8G-8K and which are in plain view format.

Exposed surfaces of portions of an embedded cell, as in various exemplary embodiments of the present invention, which otherwise may provide an access port or peep hole, may be filled in and/or covered with insulating material or with conductive material that is subsequently covered with insulating material or an insulating layer. The hole or void may be covered or filled to reduce or eliminate direct external access to the cell.

Electrochemical devices other than those shown in the various exemplary embodiments of the present invention shown in FIGS. 1A-8K may be used as needed. Electrochemical devices may also include, for example, an encapsulate that may comprise a ceramic-metal composite laminate, which may include a multiple of alternating layers of Zirconium Nitride and Zirconium or Titanium Nitride and Titanium.

Examples of methods used to deposit $LiCoO_2$ are disclosed in U.S. Patent Publication No. 2007/0125638, which is incorporated herein by reference in its entirety.

The layers of PCBs in various exemplary embodiments of the present invention, including the conductive or insulating surfaces of the PCBs, may be part of any integrated circuit that may include memory devices, processors or other logic circuits.

PCBs in various exemplary embodiments of the present invention may include a flexible circuit board which may include, for example, multiple circuit board layers. The multiple circuit board layers may include or not include traces, single or double sided, semi-rigid, a film and/or a polyimide film, such as, for example, Kapton®.

In certain embodiments of the present invention, the layers of PCBs in various exemplary embodiments of the present invention may act as an encapsulate for the electrochemical cell such as, for example, a thin film battery.

Exemplary embodiments of the present invention may also include multiple electrochemical devices stacked upon each other, multiple PCBs stacked upon each other and/or multiple layers within a PCB having either conductive or insulating surfaces or layers.

Exemplary embodiments of the present invention may also include multiple electrochemical devices stacked upon electrical contacts.

Exemplary embodiments of the present invention provide alternative methods to encapsulate the chemically and mechanically sensitive layers of electrochemical devices. Exemplary embodiments of the present invention also avoid problems related to temperature changes causing the gas within the metal and plastic pouches encapsulating the electrochemical device to expand and/or contract and the seals of the metal and plastic pouches from blowing out.

Exemplary embodiments of the present invention also provide a rechargeable secondary battery directly fabricated within one or more PCBs. Such batteries provide power during times when the circuit is powered off and are quickly and easily recharged when power resumes. Critical circuitry may benefit from localized power provided by such batteries. The exemplary embodiments also provide for less expensive and more reliable encapsulation and better approaches to providing electrically conductive contacts, including encapsulation that is substantially thinner than known encapsulation methods. The exemplary embodiments also provide flexible integrated circuits and/or flexible printed circuit boards with thin film flexible batteries coupled thereon.

The electrochemical device may comprise a discrete device (e.g., fully packaged with its own substrate and own encapsulation) in a PCB. For example, prior to its integration into the PCB, the electrochemical device may be fabricated as a discrete device, and then integrated into the PCB with its substrate and encapsulation as a whole.

Embodiments of the present invention described herein are exemplary only. One skilled in the art may recognize variations from the embodiments specifically described herein, which are intended to be within the scope of this disclosure. As such, the invention is limited only by the following claims. The present invention covers such variations provided that they come within the scope of the appended claims and their equivalents.

What is claimed is:

1. A printed circuit board comprising:
    a layer stack having two electrically insulating layers comprising conductor traces,
    wherein each of said electrically insulating layers having outside edges that comprises a perimeter; and
    an electrochemical cell inserted between said electrically insulating layers, the electrochemical cell having a top layer and a bottom layer,
    wherein the top layer and the bottom layer of said electrochemical cell extend laterally beyond the perimeter of one of said insulating layers.

2. The printed circuit board of claim 1, wherein the top layer and the bottom layer are two terminals and said electrochemical cell extends laterally beyond the perimeter of one of said electrically insulating layers to provide direct and external electrical access to one of said terminals.

3. The printed circuit board of claim 1, further comprising an electrical contact in electrical connection with said electrochemical cell, said electrical contact being externally accessible through an access port.

4. The printed circuit board of claim 3 wherein said electrochemical cell comprises a terminal and wherein said electrical contact electrically connects with said terminal and said terminal is not externally accessible through said access port.

5. The printed circuit board of claim 4 further comprising conductor material within said access port and further comprising a cap of insulating material over said access port.

6. The printed circuit board of claim 1 wherein said electrochemical cell is approximately the same thickness as the combination of two of said electrically insulating layers.

7. The printed circuit board of claim 1 wherein said electrochemical cell is thicker than the combination of two of said electrically insulating layers.

8. The printed circuit board of claim 1 wherein said electrochemical cell is thinner than the combination of two of said electrically insulating layers.

9. The printed circuit board of claim 1 wherein said electrochemical cell is thicker than at least one of said insulating layers.

10. The printed circuit board of claim 1 wherein said electrochemical cell is thinner than at least one of said insulating layers.

11. The printed circuit board of claim 1 wherein said electrochemical cell is about the same thickness as at least one of said insulating layers.

12. A printed circuit board comprising: two insulating layers with at least one electrically insulating layer comprising conductor traces;
    an interior defined directly between the two insulating layers;
    an electrochemical cell located within the interior of said electrically insulating layers; and
    a space located at an edge of said electrochemical cell in the interior, the space defined between said electrochemical cell and the electrically insulating layers.

13. The printed circuit board of claim 12 wherein said electrochemical cell extends laterally beyond the perimeter of said electrically insulating layer.

14. The printed circuit board of claim 12, further comprising an electrically conducting layer wherein said electrochemical cell is embedded between said electrically conducting layer and said electrically insulating layer.

15. The printed circuit board of claim 12, further comprising an electrically conducting layer wherein said electrically conducting layer is embedded between said electrochemical cell and said electrically insulating layer.

16. The printed circuit board of claim 12, further comprising two electrically conducting layers wherein said electrochemical cell is embedded between said electrically conducting layers.

17. The printed circuit board of claim 12, further comprising two electrically conducting layers.

18. The printed circuit board of claim 12, further comprising electrical contact in electrical connection with said electrochemical cell, said electrical contact being externally accessible.

* * * * *